US012639615B2

(12) United States Patent
Bravyi et al.

(10) Patent No.: US 12,639,615 B2
(45) Date of Patent: May 26, 2026

(54) ENTANGLEMENT FORGING FOR QUANTUM SIMULATIONS

(71) Applicant: International Business Machines Corporation, Armonk, NY (US)

(72) Inventors: Sergey Bravyi, Ossining, NY (US); Sarah Elizabeth Sheldon, Tarrytown, NY (US); Mario Motta, San Jose, CA (US); Antonio Mezzacapo, Tarrytown, NY (US); Tanvi Pradeep Gujarati, San Jose, CA (US); Andrew Eddins, Washington, DC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1129 days.

(21) Appl. No.: 17/200,331

(22) Filed: Mar. 12, 2021

(65) Prior Publication Data

US 2022/0292381 A1 Sep. 15, 2022

(51) Int. Cl.
| | |
|---|---|
| *G06N 10/80* | (2022.01) |
| *G06F 30/20* | (2020.01) |
| *G06N 10/20* | (2022.01) |

(52) U.S. Cl.
CPC ............. *G06N 10/80* (2022.01); *G06F 30/20* (2020.01); *G06N 10/20* (2022.01)

(58) Field of Classification Search
CPC ......... G06N 10/20; G06N 10/80; G06F 30/20
See application file for complete search history.

(56) References Cited

U.S. PATENT DOCUMENTS

| | | | |
|---|---|---|---|
| 9,026,574 B2 | 5/2015 | Macready et al. | |
| 10,223,084 B1 | 3/2019 | Dunn | |

(Continued)

FOREIGN PATENT DOCUMENTS

| | | | | |
|---|---|---|---|---|
| WO | WO-2019057317 A1 * | 3/2019 | ............. | G06N 10/00 |
| WO | 2019229527 | 12/2019 | | |

OTHER PUBLICATIONS

Authors: Peng et al. Title: Simulating Large Quantum Circuits on a Small Quantum Computer Date: Dec. 8, 2020 (Year: 2020).*

(Continued)

*Primary Examiner* — Luis A Sitiriche
*Assistant Examiner* — Amy Tran
(74) *Attorney, Agent, or Firm* — Amin, Turocy & Watson, LLP

(57) ABSTRACT

Techniques for quantum entanglement forging for quantum simulations are presented. A decomposer component can decompose a weakly entangled variational state into respective local components of the weakly entangled variational state, wherein the respective local components describe respective tensor product states. A quantum computing simulator component can perform respective quantum simulations of the respective local components of the weakly entangled variational state, and can determine respective portions of variational energy contributed by the respective tensor product states associated with the respective local components based on the respective quantum simulations of the respective local components of the weakly entangled variational state. An energy determination component can determine a variational energy associated with the weakly entangled variational state based on the respective portions of the variational energy contributed by the respective tensor product states.

20 Claims, 9 Drawing Sheets
(1 of 9 Drawing Sheet(s) Filed in Color)

(56)                    References Cited

U.S. PATENT DOCUMENTS

| | | | |
|---|---|---|---|
| 10,311,370 | B2 | 6/2019 | Bravyi et al. |
| 2018/0096085 | A1 | 4/2018 | Rubin |
| 2018/0349605 | A1* | 12/2018 | Wiebe .................... G06N 3/045 |
| 2019/0164076 | A1 | 5/2019 | Kim et al. |
| 2019/0229894 | A1* | 7/2019 | Samid ..................... H04L 9/085 |
| 2020/0160204 | A1 | 5/2020 | Johnson et al. |
| 2020/0193319 | A1 | 6/2020 | Chen et al. |
| 2020/0293936 | A1 | 9/2020 | Granade et al. |

OTHER PUBLICATIONS

Authors: Anwar et al Title: Smallest state spaces for which bipartite entangled quantum states are separable Date: May 14, 2015 (Year: 2015).*

Hastings, "An Area Law for One Dimensional Quantum Systems," J. Stat. Mech. (2007) P08024, 15 pages.

Wolf et al., "Area laws in quantum systems: mutual information and correlations," Phys. Rev. Lett. 100, 070502—Published Feb. 20, 2008, 4 pages.

Schuch et al., "Entropy scaling and simulability by Matrix Product States," Phys. Rev. Lett. 100, 030504—Published Jan. 25, 2008, 4 pages.

Bravyi et al., "Trading classical and quantum computational resources," Physical Review X 6, 021043 (2016) 14 pages.

Peng et al., "Simulating Large Quantum Circuits on a Small Quantum Computer," arXiv:1904.00102v1 [quant-ph] Mar. 29, 2019, 18 pages.

Perlin et al., "Quantum Circuit Cutting: Divide and Compute with Maximum Likelihood Tomography," arXiv:2005.12702v3 [quant-ph], Dec. 13, 2020, 32 pages.

Elfving et al., "Simulating quantum chemistry in the seniority-zero space on qubit-based quantum computers," arXiv:2002.00035v2 [quant-ph] Nov. 30, 2020, 15 pages.

Fujii et al., "Deep Variational Quantum Eigensolver: a divide-and-conquer method for solving a larger problem with smaller size quantum computers," arXiv:2007.10917v1 [quant-ph] Jul. 21, 2020, 8 pages.

Colless et al., "Computation of Molecular Spectra on a Quantum Processor with an Error-Resilient Algorithm," Phys. Rev. X 8, 011021—Published Feb. 12, 2018, 7 pages.

* cited by examiner

300

304

302

$$W(\theta) = \begin{bmatrix} 1 & 0 & 0 & 0 \\ 0 & \cos\theta & -\sin\theta & 0 \\ 0 & \sin\theta & \cos\theta & 0 \\ 0 & 0 & 0 & -1 \end{bmatrix} =$$

306

$\theta$

FIG. 3

400
406
402  404
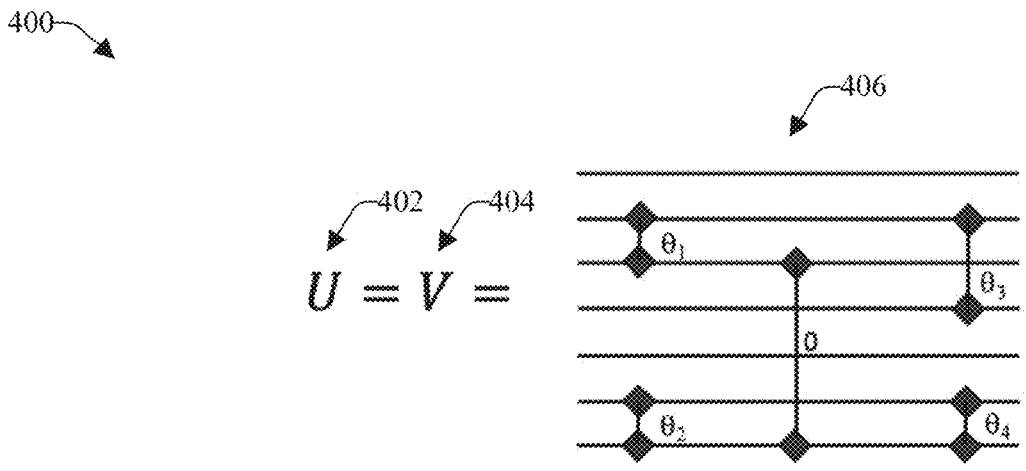
$$U = V =$$
408
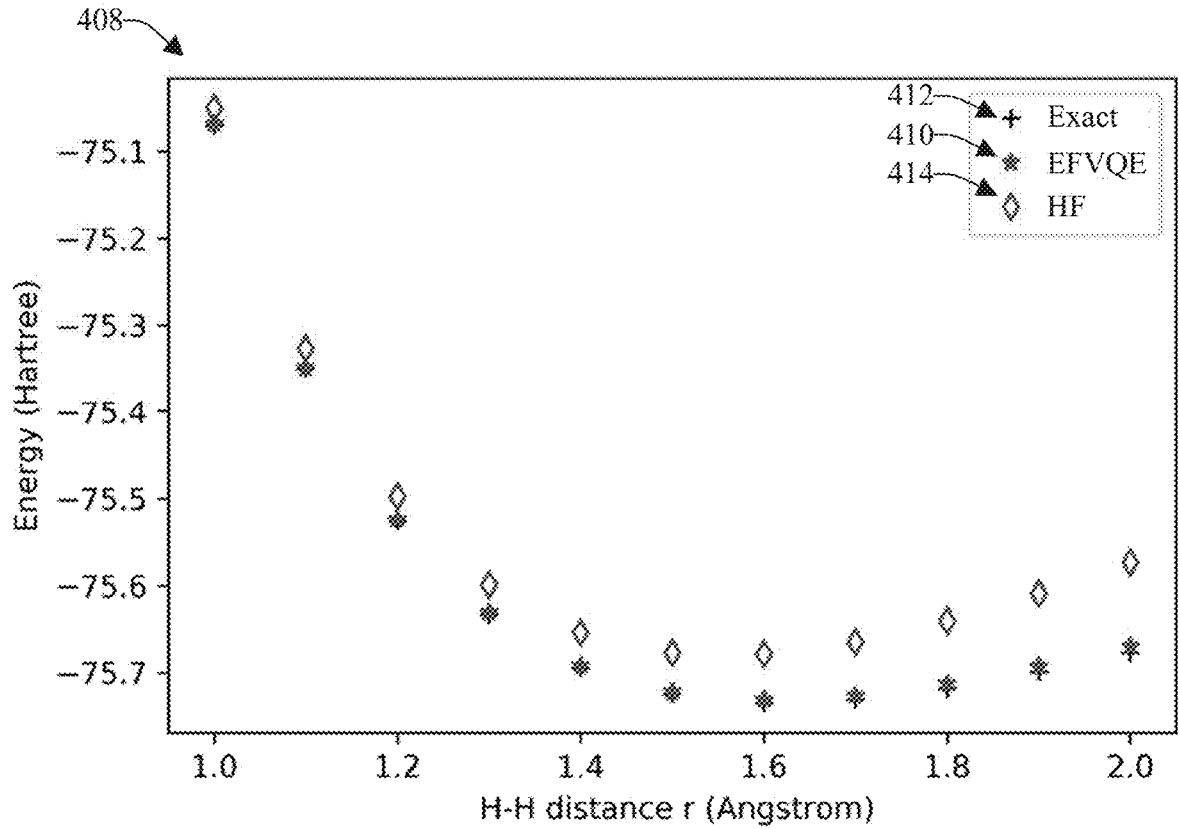
FIG. 4

500

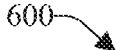
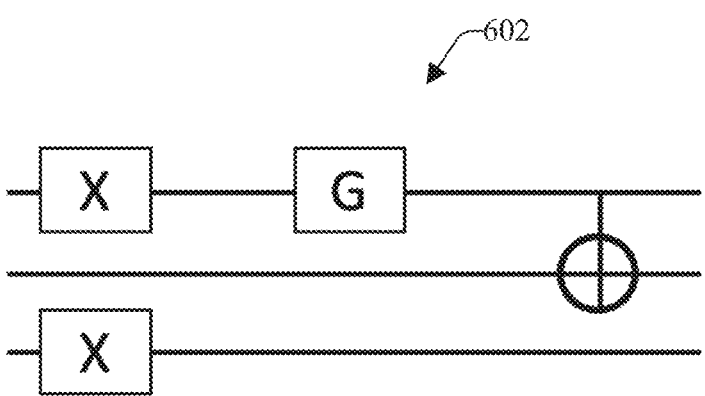
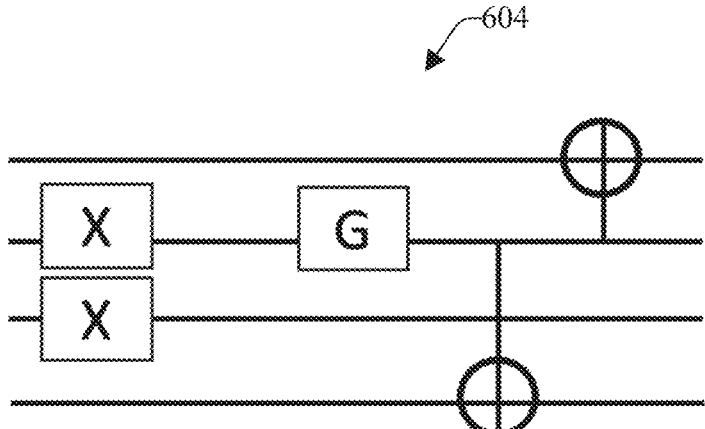
FIG. 6

700

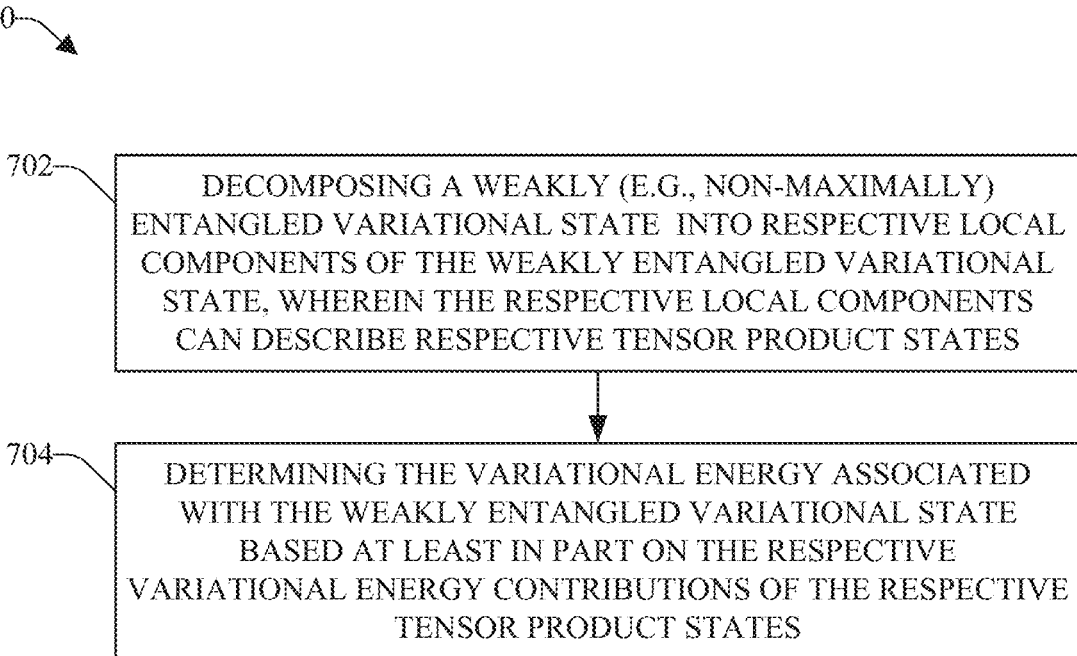

702

DECOMPOSING A WEAKLY (E.G., NON-MAXIMALLY)
ENTANGLED VARIATIONAL STATE  INTO RESPECTIVE LOCAL
COMPONENTS OF THE WEAKLY ENTANGLED VARIATIONAL
STATE, WHEREIN THE RESPECTIVE LOCAL COMPONENTS
CAN DESCRIBE RESPECTIVE TENSOR PRODUCT STATES

704

DETERMINING THE VARIATIONAL ENERGY ASSOCIATED
WITH THE WEAKLY ENTANGLED VARIATIONAL STATE
BASED AT LEAST IN PART ON THE RESPECTIVE
VARIATIONAL ENERGY CONTRIBUTIONS OF THE RESPECTIVE
TENSOR PRODUCT STATES

FIG. 7

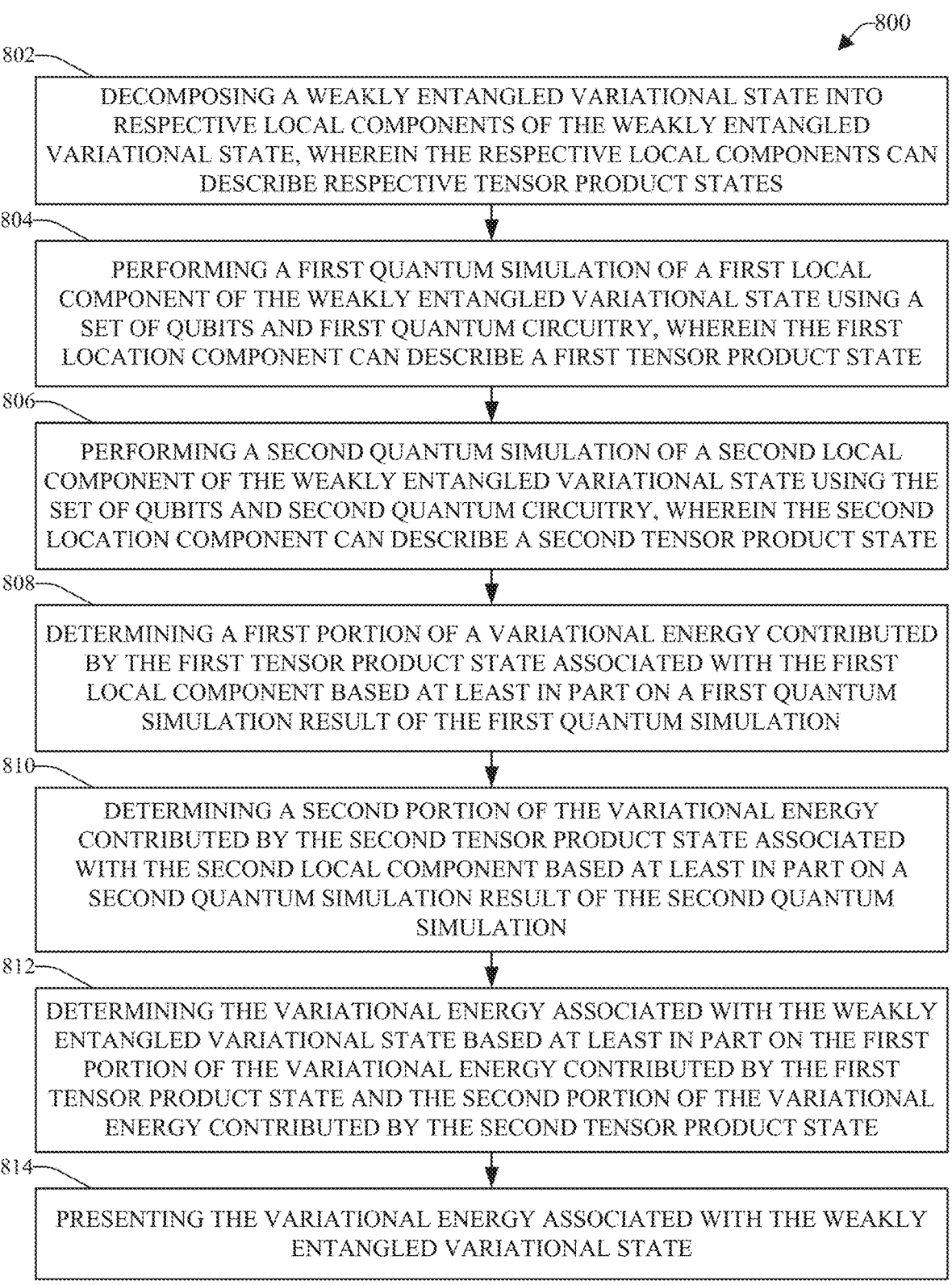

800

802 — DECOMPOSING A WEAKLY ENTANGLED VARIATIONAL STATE INTO RESPECTIVE LOCAL COMPONENTS OF THE WEAKLY ENTANGLED VARIATIONAL STATE, WHEREIN THE RESPECTIVE LOCAL COMPONENTS CAN DESCRIBE RESPECTIVE TENSOR PRODUCT STATES

804 — PERFORMING A FIRST QUANTUM SIMULATION OF A FIRST LOCAL COMPONENT OF THE WEAKLY ENTANGLED VARIATIONAL STATE USING A SET OF QUBITS AND FIRST QUANTUM CIRCUITRY, WHEREIN THE FIRST LOCATION COMPONENT CAN DESCRIBE A FIRST TENSOR PRODUCT STATE

806 — PERFORMING A SECOND QUANTUM SIMULATION OF A SECOND LOCAL COMPONENT OF THE WEAKLY ENTANGLED VARIATIONAL STATE USING THE SET OF QUBITS AND SECOND QUANTUM CIRCUITRY, WHEREIN THE SECOND LOCATION COMPONENT CAN DESCRIBE A SECOND TENSOR PRODUCT STATE

808 — DETERMINING A FIRST PORTION OF A VARIATIONAL ENERGY CONTRIBUTED BY THE FIRST TENSOR PRODUCT STATE ASSOCIATED WITH THE FIRST LOCAL COMPONENT BASED AT LEAST IN PART ON A FIRST QUANTUM SIMULATION RESULT OF THE FIRST QUANTUM SIMULATION

810 — DETERMINING A SECOND PORTION OF THE VARIATIONAL ENERGY CONTRIBUTED BY THE SECOND TENSOR PRODUCT STATE ASSOCIATED WITH THE SECOND LOCAL COMPONENT BASED AT LEAST IN PART ON A SECOND QUANTUM SIMULATION RESULT OF THE SECOND QUANTUM SIMULATION

812 — DETERMINING THE VARIATIONAL ENERGY ASSOCIATED WITH THE WEAKLY ENTANGLED VARIATIONAL STATE BASED AT LEAST IN PART ON THE FIRST PORTION OF THE VARIATIONAL ENERGY CONTRIBUTED BY THE FIRST TENSOR PRODUCT STATE AND THE SECOND PORTION OF THE VARIATIONAL ENERGY CONTRIBUTED BY THE SECOND TENSOR PRODUCT STATE

814 — PRESENTING THE VARIATIONAL ENERGY ASSOCIATED WITH THE WEAKLY ENTANGLED VARIATIONAL STATE

FIG. 8

ENTANGLEMENT FORGING FOR QUANTUM SIMULATIONS

BACKGROUND

The subject disclosure relates to quantum computing, and more specifically, to entanglement forging for quantum simulations.

SUMMARY

The following presents a summary to provide a basic understanding of one or more embodiments of the disclosed subject matter. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, structures, computer-implemented methods, apparatuses, and/or computer program products that can employ entanglement forging for quantum simulations are provided.

An embodiment relates to a computer-implemented method that comprises decomposing, by a processor component, a non-maximally entangled variational state into respective local components of the non-maximally entangled variational state, wherein the respective local components describe respective tensor product states. The computer-implemented method also can comprise determining, by the processor component, a variational energy associated with the non-maximally entangled variational state based on respective variational energy contributions of the respective tensor product states, thereby permitting a Hamiltonian nominally associated with a first number of qubits to be executed by a quantum computer device having a second number of qubits that is less than the first number of qubits.

According to another embodiment, a system can comprise a memory that stores computer-executable components; and a processor, operatively coupled to the memory, that executes computer-executable components. The computer-executable components can comprise a decomposer component that can decompose a non-maximally entangled variational state into respective local components of the non-maximally entangled variational state, wherein the respective local components can describe respective tensor product states. The computer-executable components also can comprise an energy determination component that can determine a variational energy associated with the non-maximally entangled variational state based on respective portions of variational energy that can be contributed by the respective tensor product states, thereby permitting a Hamiltonian nominally associated with a first number of qubits to be executed by a quantum computer device having a second number of qubits that is less than the first number of qubits.

According to still another embodiment, a computer program product can facilitate quantum simulations associated with quantum circuitry. The computer program product can comprise a computer readable storage medium having program instructions embodied therewith. The program instructions can be executable by a processor to cause the processor to deconstruct a non-maximally entangled variational state into respective components of the non-maximally entangled variational state, wherein the respective components are associated with respective tensor product states. The program instructions also can be executable by the processor to cause the processor to determine a variational energy associated with the non-maximally entangled variational state based on respective portions of variational energy contributed by the respective tensor product states, thereby permitting a Hamiltonian nominally associated with a first number of qubits to be executed by a quantum computer device having a second number of qubits that is less than the first number of qubits.

These and other features will become apparent from the following detailed description of illustrative embodiments thereof, which is to be read in connection with the accompanying drawings.

DESCRIPTION OF THE DRAWINGS

The patent or application file contains at least one drawing executed in color. Copies of this patent or patent application publication with color drawing(s) will be provided by the Office upon request and payment of the necessary fee.

FIG. 3 presents a diagram of an example two-qubit gate that can preserve the Hamming weight of bit strings, in accordance with various aspects and embodiments of the disclosed subject matter.

FIG. 4 presents a diagram of non-limiting example entanglement forging quantum simulation conditions and results with regard to an entanglement forging quantum simulation of a water molecule in a minimal Slater-type orbital (STO)-6G basis, using the disclosed entanglement forging techniques, in accordance with various aspects and embodiments of the disclosed subject matter.

FIG. 6 depicts a diagram of example state encodings to encode certain states based on a state encoding algorithm, in accordance with various aspects and embodiments of the disclosed subject matter.

FIG. 7 illustrates a flow diagram of an example, non-limiting method that can employ quantum entanglement forging for quantum simulations, in accordance with various aspects and embodiments of the disclosed subject matter.

FIG. 8 depicts a flow diagram of another example, non-limiting method that can employ quantum entanglement forging for quantum simulations, in accordance with various aspects and embodiments of the disclosed subject matter.

DETAILED DESCRIPTION

Figure 1:
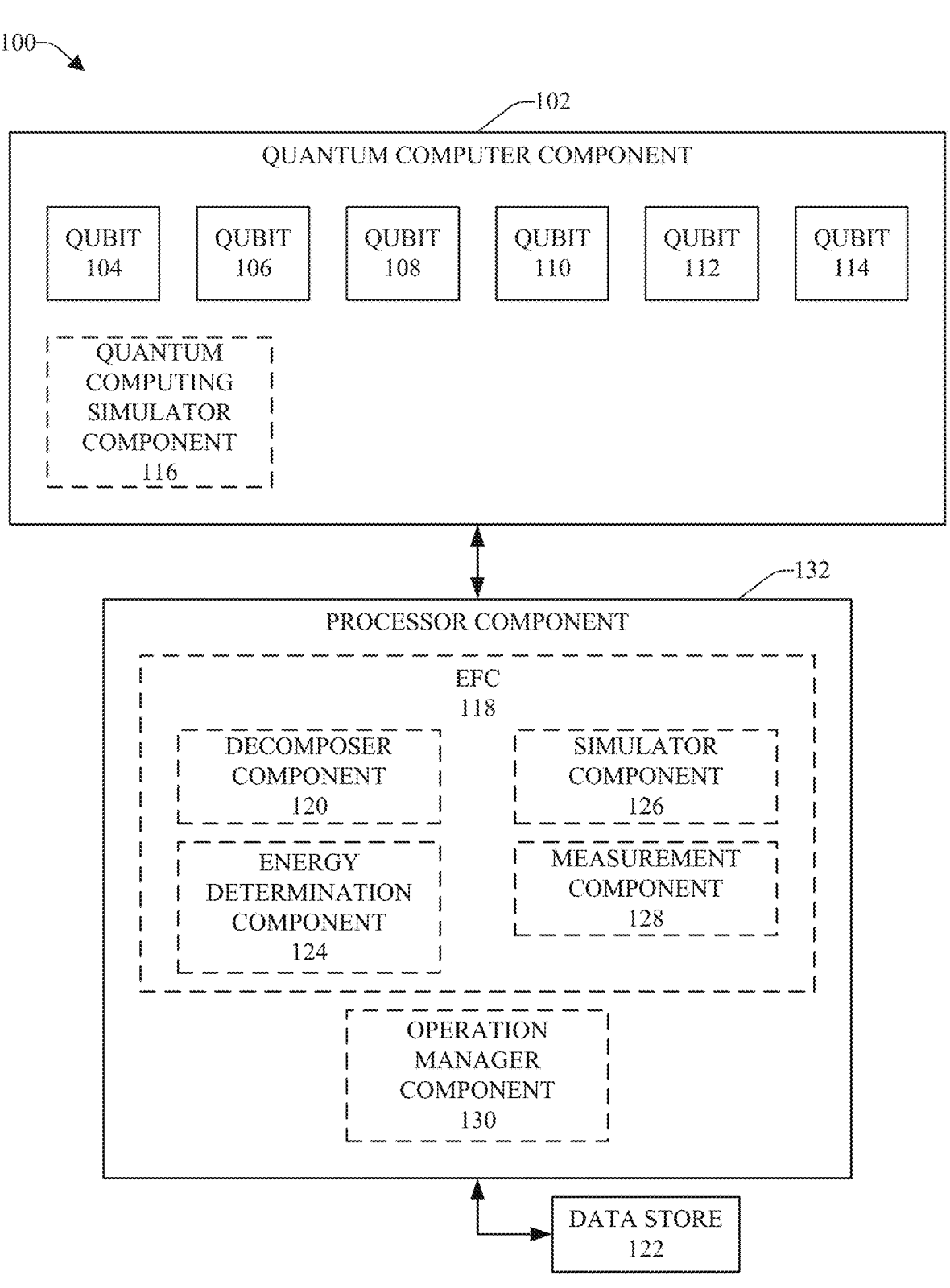
FIG. 1 illustrates a block diagram of an example, non-limiting system illustrates a block diagram of an example, non-limiting system that can employ quantum entanglement forging for quantum simulations, in accordance with various aspects and embodiments of the disclosed subject matter.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

The subject disclosure relates to quantum computing using quantum circuits. Quantum computing employs quantum physics to encode and process information rather than binary digital techniques based on transistors. A quantum computing device can employ quantum bits (also referred to as qubits) that operate according to the laws of quantum physics and can exhibit phenomena such as superposition and entanglement. The superposition principle of quantum physics allows qubits to be in a state that partially represent both a value of "1" and a value of "0" at the same time. The entanglement principle of quantum physics allows qubits to be correlated with each other such that the combined states of the qubits cannot be factored individual qubit states. For instance, a state of a first qubit can depend on a state of a second qubit. As such, a quantum circuit can employ qubits to encode and process information in a manner that can be significantly different from binary digital techniques based on transistors.

Quantum computers, comprising qubits, can be utilized to perform quantum simulations using the qubits. For instance, variational quantum eigensolver (VQE) is a suite of quantum simulation algorithms that can minimize an expected value of a cost function Hamiltonian over a class of variational states generated by parameterized quantum circuits, comprising qubits, of a quantum computer. The ability to generate entangled variational states that lack a concise classical description can make VQE potentially more powerful than classical variational methods. VQE can be robust against systematic unitary errors in the implementation of two-qubit gates. VQE can be performed utilizing high-fidelity single-qubit gates, preparation of basis states, and measurements.

One problem that can arise when using quantum computers to try to perform VQE simulations can be the size of the quantum computer (e.g., the number of qubits of the quantum computer). For instance, if there is a client job that calls for executing a VQE simulation of a 100-qubit Hamiltonian, and there is only a 50-qubit quantum computer device available to execute the VQE simulation, using certain traditional techniques, the VQE simulation of the 100-qubit Hamiltonian typically may not be able to be executed effectively using the 50-qubit quantum computer device.

It can be desirable to be able to execute quantum simulations, such as VQE simulations, of Hamiltonians that call for the use of a relatively large number of qubits using a relatively smaller quantum computer device that has a relatively smaller number of qubits. The disclosed subject matter can be implemented to produce a solution to all or at least some of these problems and/or other problems with traditional quantum computing and quantum simulations associated with qubits, including introducing practical, efficient, and desirably implementable procedures that can desirably enable quantum simulations, such as VQE simulations, of Hamiltonians that call for the use of a relatively large number of qubits to be executed using a relatively smaller quantum computer device that has a relatively smaller number of qubits.

To that end, the various aspects and embodiments herein relate to techniques for reducing the number of qubits that have to be utilized for quantum simulations. The disclosed subject matter will refer to such techniques for reducing the number of qubits that have to be utilized for quantum simulations as techniques for entanglement forging for quantum simulations or by other similar names, such as referenced herein. The disclosed subject matter can comprise a decomposer component that can decompose a weakly entangled variational state (e.g., a non-maximally entangled variational state) into respective local components of the weakly entangled variational state, wherein the respective local components can describe respective tensor product states. The disclosed subject matter also can comprise a quantum computing simulator component that can perform respective quantum simulations (e.g., variational VQE simulations) of the respective local components of the weakly entangled variational state, and can determine respective portions of variational energy contributed by the respective tensor product states associated with the respective local components based at least in part on the respective quantum simulations of the respective local components of the weakly entangled variational state. The disclosed subject matter further can include an energy determination component that can determine a variational energy associated with the weakly entangled variational state based at least in part on the respective portions of the variational energy contributed by the respective tensor product states. For instance, the energy determination component can determine the variational energy associated with the weakly entangled variational state based at least in part on (e.g., as a function of) a linear combination of the respective portions of the variational energy contributed by the respective tensor product states.

These and other aspects and embodiments of the disclosed subject matter will now be described with respect to the drawings.

FIG. 1 illustrates a block diagram of an example, non-limiting system 100 that can employ quantum entanglement forging for quantum simulations, in accordance with various aspects and embodiments of the disclosed subject matter. The system 100 can comprise a quantum computer component 102 that can include various quantum devices, quantum circuitry, and/or other components. The quantum devices can comprise, for example, a desired number (n) of qubit components (also referred to herein as qubits), such as, for example, qubit 104, qubit 106, and qubit 108, qubit 110, qubit 112, and qubit 114. In some embodiments, the quantum computer component 102 can comprise one or more quantum processor components (e.g., one or more quantum processor units (QPUs)) that can comprise or be associated with the qubits (e.g., 104, 106, 108, 110, 112, 114). While six qubits (e.g., 104, 106, 108, 110, 112, 114) are shown in the quantum computer component 102 for illustrative purposes, and for reasons of brevity or clarity, it is to be appreciated and understood that the quantum computer component 102 can comprise a desired number (n) of qubits that can be more than six qubits (e.g., 10 qubits, 25 qubits, 50 qubits, or 100 qubits, or virtually any number (n) of qubits that can be greater than or less than 100 qubits). The quantum computer component 102 can be programmed and desired quantum circuits, comprising qubits (e.g., 104, 106, 108, 110, 112, 114) and other quantum devices, circuitry, and components, can be formed, for example, based on, a set of instructions (e.g., assembled sequence of instructions) that can be input to and run (e.g., executed) on the quantum computer component 102 to create and operate desired quantum circuits, wherein the structure of the quantum circuits, and operations (e.g., quantum operations) performed by the quantum circuits, can be based on the set of instructions. In response to execution of a quantum program, comprising or associated with the set of instructions and/or comprising input data or parameter data, and operation of the quantum circuits based on such quantum program, the quantum computer component 102 can produce results (e.g., data results or quantum simulation results), which also can be referred to as readout results or readout determinations. The quantum computer component 102 can present (e.g., communicate or transmit) the results as an output.

The quantum computer component 102 also can comprise a quantum computing simulator component 116 that can perform quantum simulations of various desired problems, including performing quantum simulations of Hamiltonians, using desired quantum simulation techniques and algorithms. In some embodiments, the quantum computing simulator component 116 can perform VQE simulations of Hamiltonians using desired VQE simulation techniques and algorithms. To perform the quantum simulations, the quantum computing simulator component 116 can be associated with (e.g., connected to) other components and circuitry of the quantum computer component 102, including the qubits (e.g., 104, 106, 108, 110, 112, 114), quantum processor(s), or other quantum components, devices, and/or circuitry.

There can be instances where it can be desirable to execute a quantum simulation (e.g., a VQE simulation) of a Hamiltonian involving a relatively larger number of qubits (e.g., a 100-qubit Hamiltonian) using a quantum computer that has a relatively smaller number of qubits (e.g., 50 qubits). The system 100 can utilize and implement quantum entanglement forging for quantum simulations that can desirably (e.g., suitably, improvedly, or optimally) enable execution of quantum simulations of Hamiltonians that call for the use of a relatively large number (e.g., 100) of qubits using a relatively smaller quantum computer device that has a relatively smaller number (e.g., 50) of qubits. The disclosed subject matter, by employing the disclosed entanglement forging techniques for quantum simulations, can improve operation of a computer (e.g., a computer comprising entanglement forging component 118, processor component 132, data store 122, and/or other components) associated with the quantum computer component 102 and also can improve operation of a quantum computer itself, as, for example, the disclosed subject matter can enable the determination (e.g., calculation) of variational energy associated with quantum simulation of a desired Hamiltonian using a quantum computer (e.g., quantum computer component 102) that has a second number of qubits (e.g., executed by the quantum computer component 102) that is less than (e.g., half of) a first number of qubits that otherwise would be nominally associated with, e.g., mapped to, the desired Hamiltonian to enable simulation of the desired Hamiltonian (e.g., by an unimproved quantum computer having the first (e.g., larger) number of qubits), as more fully described herein.

The disclosed subject matter, by employing the disclosed entanglement forging techniques for quantum simulations, can extend the range of systems (e.g., systems comprising or associated with Hamiltonians) that can be simulated using quantum computer devices (e.g., quantum computer devices having a relatively smaller number (e.g., second number) of qubits). For instance, in the context of quantum chemistry simulations, the disclosed subject matter, by employing the disclosed entanglement forging techniques for quantum simulations, can provide desirable information about lowlying states of electrons in a molecule, which can be desirable (e.g., useful) in a variety of practical applications. For example, simulating a water molecule, utilizing the disclosed entanglement forging techniques for quantum simulations, can be useful in a variety of practical applications, as, for instance, the disclosed entanglement forging techniques for quantum simulations can desirably (e.g., more efficiently) determine (e.g., calculate) variational energy of the water molecule using a quantum computer that has a relatively smaller number of qubits, as compared to traditional quantum simulation techniques.

Material science Hamiltonians often can include only short-range interactions and can have a constant energy gap above the ground state. The entanglement area law implies that the ground state of such Hamiltonians can be well approximated by weakly entangled states. Empirical observation has shown that the ground state of many molecular Hamiltonians in the equilibrium configuration (e.g., lithium hydride (LiH), beryllium dihydride ($BeH_2$), and/or water ($H_2O$)) can be well approximated by weakly entangled states, for the partition into spin-up and spin-down orbitals.

To facilitate desirable execution of quantum simulations, the system 100 can comprise an entanglement forging component (EFC) 118 that can be associated with (e.g., communicatively connected to) the quantum computer component 102, and can perform quantum entanglement forging for quantum simulations, including managing the performance of simulations, including quantum simulations performed by the quantum computer component 102 and non-quantum simulation (e.g., classical computer simulations), for example, to desirably (e.g., suitably, improvedly, or optimally) perform (e.g., execute) quantum simulations of Hamiltonians that call for the use of a relatively large number of qubits using a relatively smaller quantum computer device that has a relatively smaller number of qubits. Entanglement forging can comprise a hybrid quantum-classical representation of weakly entangled quantum states. Entanglement forging can involve the use of fewer qubits compared with the number of qubits that have to be used to perform a fully quantum representation of a weakly entangled quantum state. A weakly entangled state (or weakly entangled variational state) can be a non-maximally entangled state, as opposed to an entangled state, which can be a maximally or fully entangled state, and as opposed to a separable state, which also can be referred to as a non-entangled state.

The EFC 118 can comprise a decomposer component 120 that can decompose or deconstruct a weakly (e.g., non-maximally) entangled variational state into respective local components of the weakly entangled variational state, wherein the respective local components can describe respective tensor product states. The respective local components can comprise, for example, a first local component (e.g., local component A) that can describe a first tensor state (and/or one or more other tensor product states associated with the first local component) and a second local component (e.g., local component B) that can describe a second tensor state (and/or one or more other tensor product states associated with the second local component). Essentially, the decomposer component 120, by decomposing or deconstructing the weakly entangled variational state into respective local components can divide the quantum simulation (e.g., VQE simulation) to be performed on the Hamiltonian and quantum state into smaller subroutines that can use a relatively smaller number of qubits (e.g., half the number of qubits) to perform the quantum simulation over the subroutines as compared to performing a full quantum simulation with a larger number of qubits.

The quantum computing simulator component 116 can perform respective quantum simulations (e.g., variational VQE simulations) of the respective local components of the weakly entangled variational state, and can determine respective portions of variational energy contributed by the respective tensor product states associated with the respective local components based at least in part on the quantum simulation results of the respective quantum simulations of the respective local components of the weakly entangled variational state. For instance, the quantum computing simulator component 116 can perform (e.g., execute) a first quantum simulation of the first local component of the weakly entangled variational state using a set of qubits (e.g., 104, 106, 108, 110, 112, 114) and first quantum circuitry associated with the set of qubits. The first quantum simulation results of the first quantum simulation can provide a desirable estimate of a first portion of the variational energy that is contributed by the first tensor product state associated with the first local component (and/or one or more other portions of the variational energy that is or are contributed by one or more other tensor product states associated with the first local component). Subsequent to the first quantum simulation, the quantum computing simulator component 116 can perform a second quantum simulation of the second local component of the weakly entangled variational state using the set (e.g., the same set) of qubits (e.g., 104, 106, 108, 110, 112, 114) and second quantum circuitry associated with the set of qubits. The second quantum simulation results of the second quantum simulation can provide a desirable estimate of a second portion of the variational energy that is contributed by the second tensor product state associated with the second local component (and/or one or more other portions of the variational energy that is or are contributed by one or more other tensor product states associated with the second local component).

The EFC 118 can receive information relating to the quantum simulation results, including the first quantum simulation results and the second quantum simulation results, from the quantum computer component 102, wherein the first quantum simulation results can comprise first information that can estimate or indicate the first portion of the variational energy that is contributed by the first tensor product state associated with the first local component (and/or one or more other portions of the variational energy that is or are contributed by one or more other tensor product states associated with the first local component), and wherein the second quantum simulation results can comprise second information that can estimate or indicate the second portion of the variational energy that is contributed by the second tensor product state associated with the second local component (and/or one or more other portions of the variational energy that is or are contributed by one or more other tensor product states associated with the second local component). The EFC 118 can comprise an energy determination component 124 that can desirably determine or estimate (e.g., suitably, sufficiently accurately, or optimally determine or estimate) the variational energy associated with the weakly entangled variational state based at least in part on the respective portions of the variational energy contributed by the respective tensor product states. For example, the energy determination component 124 can desirably determine or estimate the variational energy associated with the weakly entangled variational state based at least in part on the first portion of the variational energy contributed by the first tensor product state (and/or one or more other portions of the variational energy that is or are contributed by one or more other tensor product states associated with the first local component) and the second portion of the variational energy contributed by the second tensor product state (and/or one or more other portions of the variational energy that is or are contributed by one or more other tensor product states associated with the second local component). In some embodiments, the energy determination component 124 can determine the variational energy associated with the weakly entangled variational state based at least in part on (e.g., as a function of) a combination (e.g., a linear combination) of the respective portions (e.g., the first portion and second portion, and/or other portion(s)) of the variational energy contributed by the respective tensor product states. In certain embodiments, the energy determination component 124 can utilize classical computing means to determine the variational energy associated with the weakly entangled variational state.

In some embodiments, as part of the entanglement forging of the disclosed subject matter, to facilitate desirably (e.g., efficiently, suitably, accurately, or optimally) determining the variational energy associated with the weakly entangled variational state, the EFC 118 can simulate some of the entanglement present in the quantum system (e.g., quantum system that can represent the weakly entangled variational state and Hamiltonian under consideration) by using classical computing means, instead of generating all of the entanglement of the quantum system on the quantum computer component 102. In that regard, the EFC 118 can comprise a simulator component 126 that can simulate a portion of the entanglement present in the quantum system by using classical computing means. In certain embodiments, employing entanglement forging techniques, the simulator component 126 can simulate entanglement across a chosen partition of qubits using classical computing means, instead of quantum computing means. For instance, the quantum computer component 102, utilizing the set of qubits (e.g., 104, 106, 108, 110, 112, 114), can create entanglement among qubits in the same partition, for each partition (e.g., first local component, and second local component), without having to create entanglements across partitions. The simulator component 126 can simulate entanglement across the partitions (e.g., can simulate entanglement across the first partition associated with the first local component and the second partition associated with the second local component), as more fully described herein. For instance, the simulator component 126, employing classical computing means, can simulate entanglement across the partitions to simulate or emulate the entanglements that would have occurred if a quantum simulation, using quantum computing means, had been performed on the first partition associated with the first local component and the second partition associated with the second local component at the same time (e.g., as if there was no partition between the first and second partitions). This can reduce the depth of variational circuits (e.g., variational quantum circuits) associated with traditional quantum simulation (e.g., traditional VQE simulation) that has to create all entanglement of a quantum system in a quantum fashion using quantum computing means.

For example, during a first quantum simulation, the quantum computing simulator component 116 of the quantum computer component 102 can create (e.g., produce or generate) a first entangled state among the set of qubits (e.g., 104, 106, 108, 110, 112, 114) that can be associated with first quantum circuitry based at least in part on a first quantum simulation relating to a first local component of a weakly entangled variational state and a Hamiltonian, wherein the set of qubits and the first quantum circuitry can be associated with the first local component and a first partition. During a second quantum simulation, the quantum computing simulator component 116 can create a second entangled state among the set of qubits (e.g., 104, 106, 108, 110, 112, 114) that can be associated with second quantum circuitry based at least in part on a second quantum simulation relating to a second local component of the weakly entangled variational state and the Hamiltonian, wherein the set of qubits and the second quantum circuitry can be associated with the second local component and a second partition. The simulator component 126 of the EFC 118 can perform a non-quantum computing simulation of a third entangled state among qubits across a partition between the first partition and the second partition. For instance, the simulator component 126, employing classical computing means (e.g., classical computing functions and operations), can simulate or create the third entangled state among qubits across the partition between the first partition (e.g., associated with the first local component) and the second partition (e.g., associated with the second local component).

In certain embodiments, the EFC 118 can employ a measurement component 128 that can measure, determine, or compute one or more desired entanglement measures or parameters, comprising, for example, an entanglement entropy or other desired entanglement measure, across a chosen partition associated with the qubits. For instance, with regard to the above example regarding simulating the third entangled state among the qubits across the partition, the measurement component 128 can measure, determine, or compute one or more desired entanglement measures or parameters, comprising, for example, an entanglement entropy or other desired entanglement measure, across the partition associated with the qubits based at least in part on the results of the non-quantum computing simulation performed by the simulator component 126. The measurement component 128 also can determine and/or provide information relating to the entanglement structure of variational states (e.g., Schmidt coefficients). Such entanglement measures or parameters, and/or information relating to the entanglement structure of variational states, typically can be not readily (e.g., not easily) accessible or available using the traditional VQE simulation.

The EFC 118 can present (e.g., display or communicate) information relating to the variational energy associated with the weakly entangled variational state, information relating to the one or more desired entanglement measures or parameters, information relating to the entanglement structure of variational states (e.g., Schmidt coefficients), and/or other desired information as an output via a desired interface (e.g., display screen or audio speaker), or via a desired communication channel (e.g., wireline or wireless communication channel) to a communication device.

In accordance with various embodiments, the system 100 can comprise an operation manager component 130, processor component 132, and the data store 122. In some embodiments, the processor component 132 can comprise, can be associated with, and/or can access and execute various components, including the decomposer component 120, the energy determination component 124, the simulator component 126, and the measurement component 128, such as described herein. The operation manager component 130 can control (e.g., manage) operations associated with the system 100 and/or processor component 132. For example, the operation manager component 130 can facilitate generating instructions to have components of or associated with the processor component 132 perform operations, and can communicate instructions to components (e.g., the decomposer component 120, the energy determination component 124, the simulator component 126, and the measurement component 128, processor component 132, and/or data store 122) of the system 100 to facilitate performance of operations by the components of the system 100 based at least in part on the instructions, in accordance with the defined entanglement forging criteria, defined entanglement forging algorithms (e.g., entanglement forging algorithms as disclosed, defined, recited, embodied or indicated herein by the methods, systems, and techniques described herein). The operation manager component 130 also can facilitate controlling data flow between the components of the processor component 132 and controlling data flow between the processor component 132 and another component(s) or device(s) (e.g., quantum computer component 102, interface component, computer, laptop computer, or other type of computing and/or communication device) of or associated with (e.g., connected to) the system 100.

The processor component 132 can work in conjunction with the other components (e.g., the decomposer component 120, the energy determination component 124, the simulator component 126, and the measurement component 128, operation manager component 130, data store 122, and/or other component) to facilitate performing the various functions of the system 100. The processor component 132 can employ one or more processors, microprocessors, or controllers that can process data, such as information relating to qubits, circuits (e.g., quantum circuitry), quantum operations, gates, entanglement forging, decomposing a quantum state, tensor product states, Hamiltonians, simulations (e.g., simulations using classical computing means), quantum simulations, variational energy, parameters, entanglement measures, measurements, functions, algorithms (e.g., algorithms as indicated or defined by the processes, protocols, methods, and/or techniques described herein; entanglement forging algorithms; and/or quantum algorithms), quantum logic, defined entanglement forging criteria, traffic flows, policies, protocols, interfaces, tools, and/or other information, to facilitate operation of the system 100, as more fully disclosed herein, and control data flow between the processor component 132 and other components (e.g., quantum computer component 102, quantum programs, data storage devices, user devices or end-point devices, computers, interface components, or other computing or communication devices) of or associated with (e.g., connected to) the system 100 and/or processor component 132.

The data store 122 can store data structures (e.g., user data, metadata), code structure(s) (e.g., modules, objects, hashes, classes, procedures) or instructions, information relating to qubits, circuits (e.g., quantum circuitry), quantum operations, gates, entanglement forging, decomposing a quantum state, tensor product states, Hamiltonians, simulations (e.g., simulations using classical computing means), quantum simulations, variational energy, parameters, entanglement measures, measurements, functions, algorithms (e.g., algorithms as indicated or defined by the processes, protocols, methods, and/or techniques described herein; entanglement forging algorithms; and/or quantum algorithms), quantum logic, defined entanglement forging criteria, traffic flows, policies, protocols, interfaces, tools, and/or other information, to facilitate controlling operations associated with the system 100. In an aspect, the processor component 132 can be functionally coupled (e.g., through a memory bus) to the data store 122 in order to store and retrieve information desired to operate and/or confer functionality, at least in part, to the decomposer component 120, the energy determination component 124, the simulator component 126, the measurement component 128, operation manager component 130, data store 122, processor component 816, data store 818, or other component, and/or substantially any other operational aspects of the system 100.

The system 100, by employing the disclosed entanglement forging techniques, can reduce the number of qubits that have to be used to perform a quantum simulation of a Hamiltonian and quantum state by two times or more. The system 100, by employing the disclosed entanglement forging techniques, can be desirably robust against systemic unitary errors in the implementation of two-qubit gates, as the system 100 can be implemented using high-fidelity single-qubit gates, preparation of basis states, and measurements, such as described herein. The system 100, by employing the disclosed entanglement forging techniques, can desirably provide information about the entanglement structure of variational states (e.g., the Schmidt coefficients) and/or desired entanglement measures or parameters (e.g., entanglement entropy), where such types of information typically can be inaccessible or unavailable by traditional VQE techniques. The system 100, by employing the disclosed entanglement forging techniques, also can desirably reduce the depth of variational quantum circuits by simulating the entanglement across a chosen partition of qubits using classical computing means (e.g., using a classical computer).

It is to be appreciated and understood that, while the disclosed subject matter describes employing entanglement forging techniques to decompose a weakly entangled variational state into two local components and thereby reducing the number of qubits that have to be used to perform a quantum simulation of a Hamiltonian and quantum state by two times, the disclosed subject matter is not so limited. In accordance with various other embodiments, the disclosed subject matter (e.g., the EMC 118) can employ the disclosed entanglement forging techniques to decompose a weakly entangled variational state into more than two local components (e.g., three, four, five, or other desired number of local components) and thereby can reduce the number of qubits that have to be used to perform a quantum simulation of a Hamiltonian and quantum state by more than two times (e.g., three, four, five, or more times). For example, the EMC 118 can employ the disclosed entanglement forging techniques to decompose a weakly entangled variational state into three local components and thereby can reduce the number of qubits that have to be used to perform a quantum simulation of a Hamiltonian and quantum state by three times (e.g., a 60-qubit Hamiltonian can be simulated using the disclosed entanglement forging simulation techniques and a quantum computer device that has 20 qubits). As another example, the EMC 118 can employ the disclosed entanglement forging techniques to decompose a weakly entangled variational state into four local components and thereby can reduce the number of qubits that have to be used to perform a quantum simulation of a Hamiltonian and quantum state by four times (e.g., an 80-qubit Hamiltonian can be simulated using the disclosed entanglement forging simulation techniques and a quantum computer device that has 20 qubits).

Figure 2:
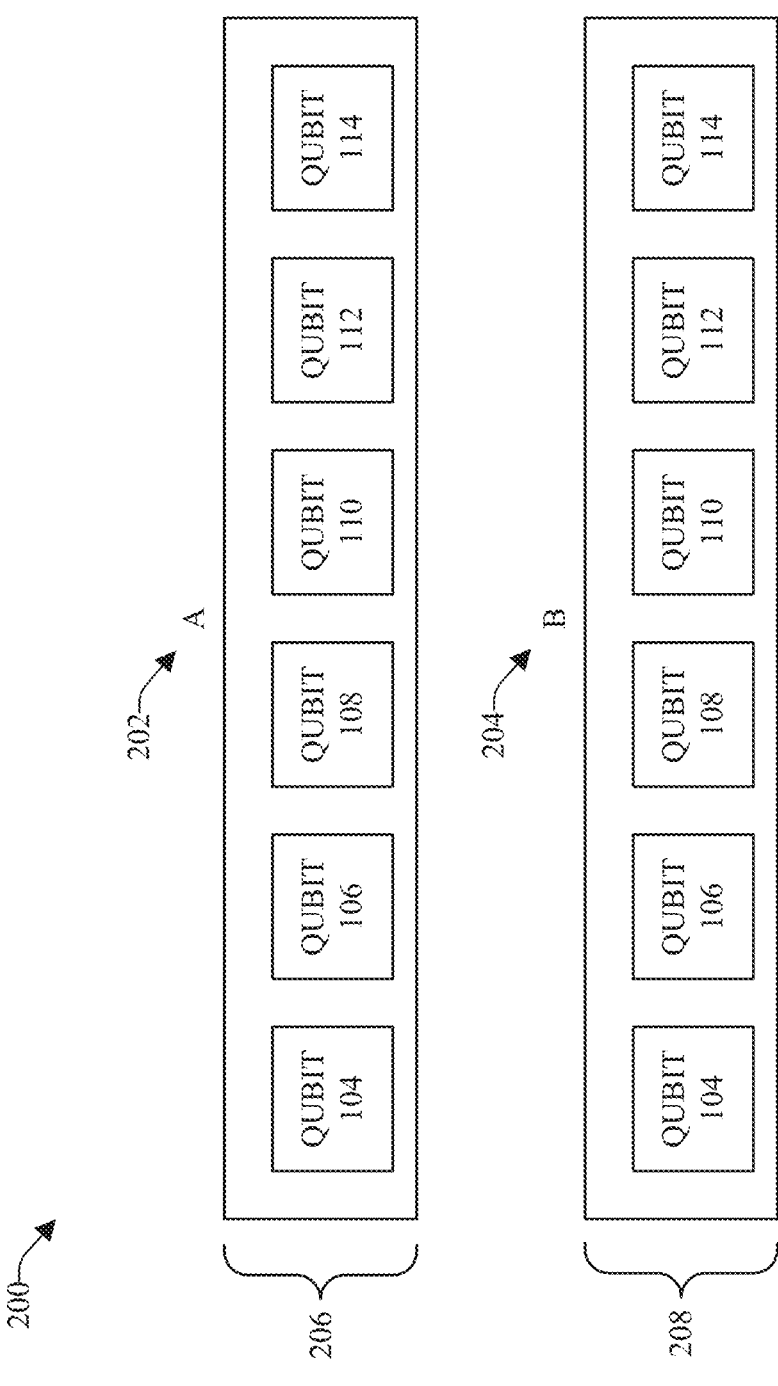
FIG. 2 depicts a block diagram of a non-limiting example of an entanglement forging procedure that can measure the expected energy of a given quantum Hamiltonian describing a bipartite or joint system on a quantum state, in accordance with various aspects and embodiments of the disclosed subject matter.

Referring to FIG. 2 (along with FIG. 1), FIG. 2 depicts a block diagram of a non-limiting example of an entanglement forging procedure 200 that can measure the expected energy of a given quantum Hamiltonian H describing a bipartite or joint system AB on a quantum state ψ, in accordance with various aspects and embodiments of the disclosed subject matter. There can be a quantum state ψ, which can describe a bipartite system AB. The example entanglement forging procedure 200 can apply to general quantum states, for example, Forged states can be used as a variational ansatz in quantum simulation (e.g., VQE-type simulation). The EFC 118 can utilize and implement the entanglement forging procedure 200 (e.g., entanglement forging quantum simulation procedure), which can be a procedure for measuring the expected energy $\langle \psi|H|\psi \rangle$ of a given quantum Hamiltonian H describing the joint system AB on the quantum state ψ. The entanglement forging procedure 200 can operate by decomposing both the Hamiltonian H and the quantum state into several local components describing individual subsystems A and B. The system 100, employing the entanglement forging procedure 200, can determine (e.g., derive or calculate) the contribution of each local component to the expected energy $\langle \psi|H|\psi \rangle$ of Hamiltonian H using a relatively smaller quantum computer (e.g., quantum computer component 102) with max (|A|, |B|) qubits (e.g., a quantum computer that can have, for example, half of the number of qubits, as compared to a full number of qubits that would otherwise be used to perform a full quantum simulation for the Hamiltonian H). The EFC 118 can determine (e.g., calculate) the full variational energy of the Hamiltonian H by combining (e.g., summing) the respective contributions of each local component (e.g., local component A and local component B) using classical computing means (e.g., a classical computer of or associated with the EFC 118). As a concrete application, the disclosed subject matter can illustrate how to use the disclosed entanglement forging techniques to simulate molecular electronic structure Hamiltonians by assigning a single qubit to each pair of spin-up and spin-down orbitals. This can achieve a desirable two times reduction in the number of qubits utilized to simulate such Hamiltonians, without loss of accuracy, as compared with the traditional quantum simulation techniques.

In accordance with the entanglement forging procedure 200, the EFC 118, employing the decomposer component 120, can decompose both the Hamiltonian H and the quantum state ψ into local components, wherein the local components can comprise local component A 202, which can describe subsystem A, and local component B 204, which can describe subsystem B. In some embodiments, the decomposer component 120 can decompose and parameterize the quantum state ψ using a Schmidt decomposition by a vector of Schmidt coefficients λ (e.g., singular values) and a pair of local unitary operators U,V. The EFC 118 can store the vector of Schmidt coefficients in the data store 122 (e.g., a data store of a classical computer). The EFC 118 can parameterize the local unitary operators U,V by quantum circuits and can implement local unitary operators U,V and associated quantum circuits on the quantum computer component 102. For instance, the local component A 202, which can be associated with local unitary operator U, can be implemented using a first quantum circuit 206 and the set of qubits (e.g., 104, 106, 108, 110, 112, 114) of the quantum computer component 102, wherein the set of qubits can comprise n qubits. The local component B 204, which can be associated with local unitary operator V, can be implemented using a second quantum circuit 208 and the set of qubits (e.g., 104, 106, 108, 110, 112, 114) of the quantum computer component 102.

In accordance with the entanglement forging procedure 200, a variational ansatz can be defined, for example, by the following equation (Eq.) (1):

$$|\Psi\rangle = \sum_{x \in S} \lambda_x U|x\rangle \otimes V|x\rangle \qquad \text{Eq. (1)}$$

for some fixed set of bit strings $S \subseteq \{0,1\}^n$, wherein $|\Psi\rangle$ can be weakly entangled if $|S| \ll 2^n$, wherein $\lambda_x$ can be coefficients (e.g., Schmidt coefficients), for each x, that can be treated as variational parameters, together with the variational angles that can specify U and V (e.g., local unitary operators), and wherein x can be a desired number. Examples of the set of bit strings S can be bit strings, such as more fully described herein. Local unitary operators U and V can be or can represent parameterized n-qubit circuits, and $\lambda_x$ can be real coefficients that can obey (e.g., comply with or conform to) the normalization condition $$\sum_{x \in S} \lambda_x^2 = 1.$$

The disclosed entanglement forging techniques, including the entanglement forging procedure 200, comprise techniques for expressing $|\Psi\rangle \langle \Psi|$ as a linear combination of tensor product states. The number of tensor product states in the decomposition can scale quadratically with the size of S and linearly with the diameter of S (e.g., the maximum Hamming distance between bit strings x, y∈S).

The decomposition of quantum state $\psi$ into local components (e.g., local component A 202 and local component B 204 respectively associated with local unitary operators U and V) of the quantum state (e.g., by the decomposer component 120) can be represented or illustrated by Eq. (2) as follows:

$$|\Psi\rangle\langle\Psi| = \sum_{x \in S} \lambda_x^2 U|x\rangle\langle x|U^\dagger \otimes V|x\rangle\langle x|V^\dagger +$$
$$\sum_{\substack{x,y \in S \\ x<y}} \frac{\lambda_x \lambda_y 4^{d_{x,y}}}{4 d_{x,y}} \sum_{m=0}^{4d_{x,y}-1} (-1)^m U|\phi_m^{x,y}\rangle\langle\phi_m^{x,y}|U^\dagger \otimes V|\phi_m^{x,y}\rangle\langle\phi_m^{x,y}|V^\dagger$$

Eq. (2)

wherein x, y, and m can respectively represent tensor product states, and wherein $d_{x,y}$ can be the number of bits i such that $x_i \neq y_i$ and $$|\phi_m^{x,y}\rangle$$

can be n-qubit tensor product states:

$$|\langle\phi_m^{x,y}\rangle = |\phi_{m,1}^{x,y}\rangle \otimes |\phi_{m,2}^{x,y}\rangle \otimes \cdots \otimes |\phi_{m,n}^{x,y}\rangle$$

$$|\phi_{m,j}^{x,y}\rangle = \begin{cases} |x_j\rangle & \text{if } x_i = y_i \\ \frac{1}{\sqrt{2}}(|x_j\rangle + e^{i\pi m/2d_{x,y}}|y_j\rangle) & \text{if } x_i \neq y_i \end{cases}$$

Molecular and material science Hamiltonians can be expressed as a linear combination of poly(n) Pauli operators, after a suitable discretization and a fermion-to-qubit mapping. For example, a 2n-qubit Hamiltonian can be expressed as follows in Eq. (3):

$$H = \sum_{a,b=1}^{h} w_{a,b} P_a \otimes P_b \quad P_a \in \{I, X, Y, Z\}^{\otimes n} \text{ n-qubit Pauli operators.}$$

Eq. (3)

With regard to determining (e.g., computing) the energy (e.g., variational energy) for a Hamiltonian (e.g., as determined by the energy determination component 124), the expected value of any Pauli term $P_a \otimes P_b$ on the 2n-qubit state $$|\Psi\rangle = \sum_{x \in S} \lambda_x U|x\rangle \otimes V|x\rangle$$

can be a function of n-qubit expected values, which can be represented, for example, in Eq. (4) as follows:

$$\langle\Psi|P_a \otimes P_b|\Psi\rangle = \sum_{x \in S} \lambda_x^2 \langle x|UP_aU^\dagger|x\rangle \otimes \langle x|VP_bV^\dagger|x\rangle +$$
$$\sum_{\substack{x,y \in S \\ x<y}} \frac{\lambda_x\lambda_y 4^{d_{x,y}}}{4d_{x,y}} \sum_{m=0}^{4d_{x,y}-1} (-1)^m \langle\phi_m^{x,y}|UP_aU^\dagger|\phi_m^{x,y}\rangle \otimes \langle\phi_m^{x,y}|VP_bV^\dagger|\phi_m^{x,y}\rangle.$$

Eq. (4)

In accordance with the entanglement forging procedure 200, respective representational portions presented or represented in Eq. (4) (e.g., the first portion or equation component associated with the first $\Sigma$ symbol; the second portion or equation component relating to local unitary operator U and associated with the third $\Sigma$ symbol; and the third portion or equation component relating to local unitary operator V and associated with the third $\Sigma$ symbol) can be evaluated by a quantum computer (e.g., the quantum computer component 102) using only n qubits (e.g., as opposed to 2n qubits when using traditional VQE simulation). In accordance with, and by applying (e.g., executing or performing), the entanglement forging procedure 200 (e.g., by the EFC 118 in conjunction with quantum computer component 102), the equation components relating to local unitary operator U and Pauli operator $P_a$, can be individually, independently, or separately evaluated by the quantum computer component 102 distinct from the evaluation of the other equation components relating to local unitary operator V and Pauli operator $P_b$, by the quantum computer component 102. In accordance with the entanglement forging procedure 200, the energy determination component 124 can determine (e.g., calculate) the total variational energy for the Hamiltonian under consideration based at least in part on (e.g., as a function of, or as a combination or summing of) the respective results (e.g., quantum simulation results) of the respective evaluations (e.g., respective quantum simulations) by the quantum computer component 102, wherein the respective results can comprise or relate to the respective portions of variational energy contributed by the respective local components (e.g., local component A 202 and local component B 204) associated with the respective local unitary operators U and V.

The factor $4^{d_{x,y}}$ in the expression for $\langle\Psi|P_a \otimes P_b|\Psi\rangle$ can exponentially amplify statistical fluctuations due to the finite number of measurements. The Hoeffding inequality implies that the number of measurements M utilized to estimate $\langle\Psi|P_a \otimes P_b|\Psi\rangle$ within a specified precision $\epsilon$ can scale as:

$$M \sim \frac{1}{\epsilon^2}\left(1 + \sum_{\substack{x,y \in S \\ x<y}} |\lambda_x\lambda_y|4^{d_{x,y}}\right)^2 \equiv \frac{F(\lambda)}{\epsilon^2}.$$

Eq. (5)

In some embodiments, to keep the overhead desirably (e.g., sufficiently, suitably, or acceptably) small, a fixed reference string $v \in \{0,1\}^n$ can be chosen, and it can be specified that $x \in S$ only if x differs from v on at most $w=O(1)$ bits, in accordance with the disclosed subject matter. Then $d_{x,y} \leq 2w=O(1)$ for all $x,y \in S$, and thus, $F(\lambda)=O(|S|^2)$ in the worst case, when the distribution of the Schmidt coefficients $$\lambda_x^2$$

can be flat. To optimize the variational parameters using local search algorithms, such as, for example, the simultaneous perturbation stochastic approximation (SPSA) algorithm, the disclosed subject matter (e.g., the EFC 118) can impose a fixed upper bound $F(\lambda) \leq F_{max}$ and can reject updates of the variational parameters $\lambda_x$ that violate the upper bound.

Figure 3:
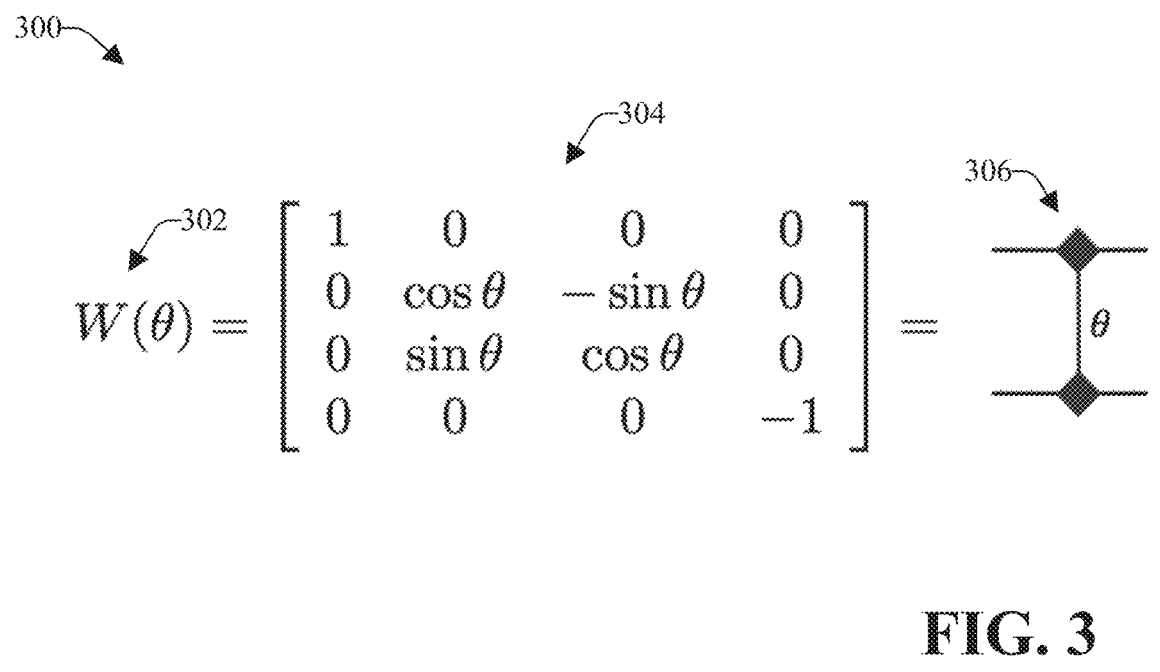

In accordance with various embodiments, the disclosed entanglement forging techniques, including the disclosed entanglement forging procedure 200, can be applied to molecular Hamiltonians. Ground states of molecular Hamiltonians are known to possess certain symmetries, including that amplitudes in the standard basis can be real, the state can be symmetric under the swap of spin-up and spin-down orbitals, and the number of electrons with a given spin orientation can be fixed. The entanglement forging ansatz can respect these symmetries if all bit strings $x \in S$ have the same Hamming weight and U=V is a variational circuit (e.g., U and V can be equivalent variational circuits) composed of two-qubit gates that can conserve the number of particles and have real matrix elements, for example, as illustrated in FIG. 3. Referring briefly to FIG. 3 (along with FIG. 1), FIG. 3 presents a diagram of an example two-qubit gate 300, that can preserve the Hamming weight of bit strings, in accordance with various aspects and embodiments of the disclosed subject matter. In the example Hamming weight representation 300, the two-qubit gate W (θ) 302 can be equal to or represented by the example matrix 304, comprising the real matrix elements shown within the matrix 304, which can be equal to or representative of the two-qubit gate W(θ) 302, which also can be diagrammatically represented as two-qubit gate θ 306.

With further regard to applications to molecular Hamiltonians, the second quantization method (which also can be referred to as occupation number representation) and the Jordan-Wigner transformation can map any molecular Hamiltonian to the one describing a system of 2n qubits, such that the first n qubits can represent spin-up orbitals and the last n qubits can represent spin-down orbitals. The Hartree-Fock (HF) approximation to the ground state can have the form:

$$|HF\rangle = |v\rangle \otimes |v\rangle, \qquad \text{Eq. (6)}$$

wherein the first $|v\rangle$ (e.g., the $|v\rangle$ that is further to the left) in Eq. (6) can relate to or represent spin-up orbitals, and the second $|v\rangle$ in Eq. (6) can relate to or represent spin-down orbitals. There can be a reference string: $v=111 \ldots 111000 \ldots 000 \in \{0,1\}^n$, wherein the 1 values in the reference string can be or represent occupied orbitals, and wherein the θ values in the reference string can be or represent empty orbitals.

As an example of an application to molecular Hamiltonians, referring briefly to FIG. 4 (along with FIGS. 1 and 2), FIG. 4 presents a diagram of non-limiting example entanglement forging quantum simulation conditions and results 400 with regard to an entanglement forging quantum simulation (e.g., entanglement forging VQE simulation) of a water molecule in a minimal Slater-type orbital (STO)-6G basis (e.g., 7 spin-up orbitals and 7 spin-down orbitals), using the disclosed entanglement forging techniques, in accordance with various aspects and embodiments of the disclosed subject matter. The entanglement forging quantum simulation, using the disclosed entanglement forging techniques described herein, can be an improvement over the HF approximation to the ground state. In this example entanglement forging quantum simulation, there can be 7 qubits (e.g., comprising qubits 104, 106, 108, 110, 112, 114) to perform a desirable quantum simulation of a water molecule, instead of having to use 14 qubits, which would be the number of qubits used if traditional VQE simulation were to be performed. In the entanglement forging quantum simulation, the core orbital and $2p_z$ orbital on O can be frozen as they do not contribute in bond formation. The example set of bit strings S for the example entanglement forging quantum simulation can be as follows:

$$S = \begin{cases} 1, 1, 1, 1, 1, 0, 0 \\ 1, 0, 1, 1, 1, 0, 1 \\ 1, 0, 1, 1, 1, 1, 0 \\ 1, 1, 1, 0, 1, 0, 1 \\ 1, 1, 1, 0, 1, 1, 0 \end{cases}.$$

As can be observed, each bit string of the set of bit strings S can have 7 respective values, since there are 7 qubits employed in the entanglement forging quantum simulation, wherein, in the bit strings, a 1 value can represent an occupied orbital and a 0 value can represent an empty orbital. As depicted in the example entanglement forging quantum simulation conditions and results 400, the example forging simulation can relate to local unitary operators U 402 and V 404, which can be variational circuits, where U 402 can be equivalent to V 404, and the variational circuits U 402 and V 404 (with U=V) can be composed of and represented by a group of two-qubit gates 406 (e.g., gates 0, $\theta_1$, $\theta_2$, $\theta_3$, and $\theta_4$), as illustrated in FIG. 4.

The example entanglement forging quantum simulation conditions and results 400 can comprise the information presented in the graph 408, which can present the energy (Hartree) of the molecular Hamiltonian of a water molecule (along the y-axis) as a function of the H-H distance r, in Angstroms (along the x-axis). The graph 408 can comprise entanglement forging quantum simulation result values for various H-H distances obtained from performing the entanglement forging quantum simulation (e.g., enforcement forging VQE), as represented by the symbol for "EFVQE" (reference numeral 410), as indicated in the legend for the graph 408, in relation to exact values for the various H-H distances as represented by the symbol for "Exact" (reference numeral 412), as indicated in the legend for the graph 408, and in relation to the Hartree-Fock (HF) approximation results for the various H-H distances as represented by the symbol for "HF" (reference numeral 414), as indicated in the legend for the graph 408. As can be observed in the graph 408, the entanglement forging quantum simulation results for the entanglement forging quantum simulation of the water molecule can be substantially close to the exact values for the water molecule, and can be significantly improved over the HF approximation results for the water molecule.

Figure 5:
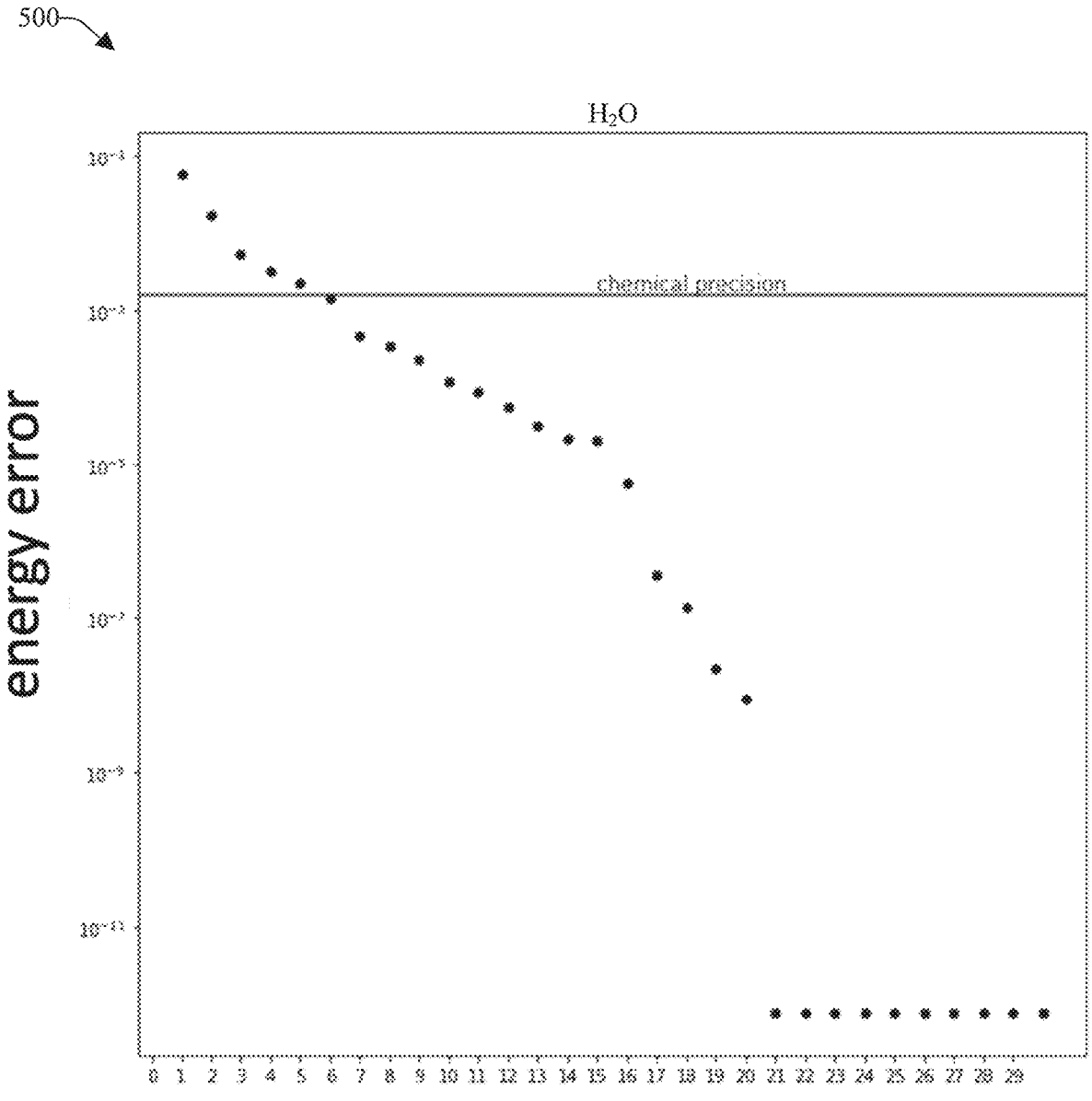
FIG. 5 presents a diagram of an example graph of a ground state energy error that can be obtained by truncating the Schmidt decomposition of the true ground state for a water ($H_2O$) molecule, in accordance with various aspects and embodiments of the disclosed subject matter.

Referring briefly to FIG. 5 (along with FIGS. 1 and 2), FIG. 5 presents a diagram of an example graph 500 of a ground state energy error that can be obtained by truncating the Schmidt decomposition of the true ground state for a water ($H_2O$) molecule, in accordance with various aspects and embodiments of the disclosed subject matter. The example graph 500 can illustrate how entangled a molecular ground state for a water molecule is, and how well the ground state can be approximated by a weakly entangled variational state for the water molecule when implementing the disclosed entanglement forging procedure (e.g., entanglement forging quantum simulation procedure and techniques), in accordance with various aspects and embodiments of the disclosed subject matter. The truncated decomposition can contain only the $\chi$ largest Schmidt coefficients. The graph 500 depicts the amount of energy error (along the y-axis) as a function of the number of Schmidt coefficients retained ($\chi$) (along the x-axis) for the entanglement forging quantum simulation for the water molecule. The disclosed subject matter (e.g., employing the disclosed entanglement forging quantum simulation procedure and techniques), can create a partition into spin-up and spin-down orbitals, wherein, for example, the qubits (e.g., qubits 104, 106, 108, 110, 112, and/or 114) can represent spin-up orbitals in the first partition associated with the first local component of the weakly entangled variational state and Hamiltonian, and the qubits (e.g., qubits 104, 106, 108, 110, 112, and/or 114) can represent spin-down orbitals in the second partition associated with the second local component of the weakly entangled variational state and Hamiltonian. As can be observed from the results presented in the graph 500, when employing the disclosed subject matter (e.g., employing the disclosed entanglement forging quantum simulation procedure and techniques), the ground state for the water molecule can be well approximated by the weakly entangled variational state, with the partition into spin-up and spin-down orbitals.

By employing the disclosed entanglement forging quantum simulation procedure and techniques, a ground state for various types of molecules can be well approximated by the weakly entangled variational state. In addition to a water molecule, such types of molecules can comprise, for example, a lithium hydride (LiH) molecule, a beryllium dihydride ($BeH_2$) molecule, or other type of molecule.

The disclosed entanglement forging procedure 200 (and the other disclosed entanglement forging techniques) can be desirably (e.g., sufficiently, acceptably, or suitably) robust against systematic unitary errors in the implementation of the variational circuits U, V. The entanglement forged version of the state $|\Psi\rangle \langle \Psi|$ can be a projector onto some pure 2n-qubit state (which possibly can be different from $\Psi$), as long as the initial product states $$(e.g., |\phi_m^{x,y}\rangle$$

can be prepared with a desirably (e.g., sufficiently, acceptably, or suitably) high fidelity. Deviations from the target variational state do not matter as long as the manifold of variational states can contain a desirably (e.g., sufficiently, acceptably, or suitably) good approximation to the desired ground state of the Hamiltonian H.

With further regard to overhead, as stated, the factor $4^{d_{x,y}}$ in the expression for $\langle \Psi|P_a \otimes P_b|\Psi\rangle$ (in Eq. (4)) can exponentially amplify statistical fluctuations due to the finite number of measurements. The Hoeffding inequality implies that the number of measurements utilized to estimate $\langle \Psi|P_a \otimes P_b|\Psi\rangle$ within a precision $\epsilon$ can scale, for example, as indicated in Eq. (5). The method can be desirably practical if d is a small constant, that is, the bit strings x and y may differ only on a few bits for all possible pairs of bit strings x and y. In some embodiments, the disclosed subject matter can desirably eliminate the factor $4^{d_{x,y}}$, such as described herein, although such modified technique (with the factor $4^{d_{x,y}}$ eliminated) potentially can be vulnerable to some systematic unitary errors in the implementation of two-qubit gates.

To facilitate eliminating the factor $4^{d_{x,y}}$, the disclosed subject matter can employ (e.g., utilize and/or apply) these techniques, equations, and algorithms, for example. Starting from a state of the form $|\Psi\rangle = \Sigma_x \lambda_x |x\rangle \otimes |x\rangle$, the disclosed subject matter (e.g., the system 100) can define the density operator $\rho$, for example, using Eq. (13) as follows:

$$\rho = \sum_{xy} \lambda_x \lambda_y |x\rangle\langle y| \otimes |x\rangle\langle y| = \sum_x \lambda_x^2 |x\rangle\langle x| \otimes |x\rangle\langle x| + \sum_{x<y} \lambda_x \lambda_y (|x\rangle\langle y| \otimes \quad \text{Eq. (13)}$$
$$|x\rangle\langle y| + |y\rangle\langle x| \otimes |y\rangle\langle x|),$$

and the expectation value (Tr) of a tensor product $A \otimes B$ can be evaluated, for example, as presented in Eq. (14) as follows:

$$Tr[\rho(A \otimes B)] = \qquad\qquad\qquad\qquad \text{Eq. (14)}$$
$$\sum_x \lambda_x^2 \langle x|A|x\rangle\langle x|B|x\rangle + \sum_{x<y} \lambda_x \lambda_y (\langle y|A|x\rangle \otimes \langle y|B|x\rangle + \langle x|A|y\rangle\langle x|B|y\rangle).$$

Defining $A_{xy}\langle = (x|A|y)$, the disclosed subject matter (e.g., the system 100) can obtain (e.g., determine or calculate) the expectation value (Tr) of a tensor product $A \otimes B$ using (e.g., applying), for example, Eq. (15) as follows:

$$Tr[\rho(A \otimes B)] = \sum_x \lambda_x^2 \langle x|A|x\rangle\langle x|B|x\rangle + \qquad \text{Eq. (15)}$$
$$\sum_{x<y} \lambda_x \lambda_y (Re(A_{xy})Re(B_{xy}) - Im(A_{xy})Im(B_{xy})),$$

and, in electronic structure simulations, imaginary parts can vanish. Defining $$|\psi_{xy,\pm}\rangle = \frac{|x\rangle \pm |y\rangle}{\sqrt{2}},$$

$$|\phi_{xy,\pm}\rangle = \frac{|x\rangle \pm i|y\rangle}{\sqrt{2}},$$

the disclosed subject matter (e.g., the system 100) can obtain (e.g., determine or calculate):

$$2 \operatorname{Re}(A_{xy}) = \langle \psi_{xy,+}|A|\psi_{xy,+}\rangle - \langle \psi_{xy,-}|A|\psi_{xy,-}\rangle \qquad \text{Eq. (16)}$$
$$1 \operatorname{Im}(A_{xy}) = \langle \phi_{xy,+}|A|\phi_{xy,+}\rangle - \langle \phi_{xy,-}|A|\phi_{xy,-}\rangle.$$

The disclosed subject matter (e.g., the system 100) can employ (e.g., apply, perform, and/or execute) a state encoding algorithm to encode the states $|\psi_{xy,\pm}\rangle$, $|\phi_{xy,\pm}\rangle$, wherein such state encoding algorithm can provide as follows:

1. find all indices M={k:$x_k \neq y_k$}; this set is to be non-empty, since x≠y;
2. find all indices T={k:$x_k$=1};
3. starting from a set of qubits (e.g., qubits 104, 106, 108, 110, 112, and/or 114) prepared in $|0\rangle$, apply a tensor product of X gates to qubits in T to obtain $|x\rangle$;
4. select an index j∈M;
5. depending on the value of $x_j \in \{0,1\}$ and the state to produce, apply one of the following gates (G) to qubit j, as shown in, and in accordance with, TABLE 1 (below);
6. if M={j}, the desired state has been obtained; and
7. otherwise, apply $\Pi_{k \in M, k \neq j}$ CNOT$_{j,k}$, wherein CNOT is a controlled NOT gate.

TABLE 1

| $x_j$ | state to produce | gate G |
|---|---|---|
| 0 | ψxy,+ | H |
| 0 | ψxy,− | HX |
| 0 | φxy,+ | SH |
| 0 | φxy,− | SHX |
| 1 | ψxy,+ | HX |
| 1 | ψxy,− | H |
| 1 | φxy,+ | SHX |
| 1 | φxy,− | SH |

Referring briefly to FIG. 6 (along with FIGS. 1 and 2), FIG. 6 depicts a diagram of example state encodings 600 to encode the states $|\psi_{xy,\pm}\rangle$, $|\phi_{xy,\pm}\rangle$ based on (e.g., by applying) the disclosed state encoding algorithm, in accordance with various aspects and embodiments of the disclosed subject matter. The example state encodings 600 can comprise a state encoding 602 that can be determined (e.g., by the EFC 118) based at least in part on application of the values x=(1,0,1), y=(0,1,1) and the disclosed state encoding algorithm, including TABLE 1. The example state encodings 600 also can comprise a state encoding 604 that can be determined (e.g., by the EFC 118) based at least in part on application of the values x=(0,1,1,0), y=(1,0,1,1) and the disclosed state encoding algorithm, including TABLE 1.

The systems and/or devices have been (or will be) described herein with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

FIG. 7 illustrates a flow diagram of an example, non-limiting method 700 that can employ quantum entanglement forging for quantum simulations, in accordance with various aspects and embodiments of the disclosed subject matter. In some embodiments, the method 700 can be performed by, for example, the EFC and/or a processor component, which can be associated with a data store. The EFC can comprise, for example, a decomposer component and an energy determination component. The EFC can be associated with (e.g., communicatively connected to) a quantum computer component that can comprise a quantum computing simulator component. Repetitive description of like elements employed in other embodiments described herein is or may be omitted for sake of brevity.

At 702, a weakly (e.g., non-maximally) entangled variational state can be decomposed into respective local components of the weakly entangled variational state, wherein the respective local components can describe respective tensor product states. The decomposer component can decompose the weakly entangled variational state into respective local components of the weakly entangled variational state, wherein the respective local components can describe respective tensor product states. In some embodiments, the quantum computing simulator component can perform respective quantum simulations of the respective local components of the weakly entangled variational state, and can determine respective portions of a variational energy contributed by the respective tensor product states associated with the respective local components based at least in part on the quantum simulation results of the respective quantum simulations of the respective local components of the weakly entangled variational state. In certain embodiments, the quantum simulations can be or can comprise VQE simulations. The EFC can manage the performance of the respective quantum simulations to have the respective quantum simulations performed using a set of qubits, wherein, for example, a first quantum simulation associated with a first local component of the weakly entangled variational state and a first tensor product state can be performed using the set of qubits and first quantum circuitry, and a second quantum simulation associated with a second local component of the weakly entangled variational state and a second tensor product state can be performed using the set of qubits and second quantum circuitry.

At 704, the variational energy associated with the weakly entangled variational state can be determined based at least in part on the respective variational energy contributions of the respective tensor product states. The energy determination component can determine the variational energy associated with the weakly entangled variational state based at least in part on (e.g., as a function of) the respective variational energy contributions of the respective tensor product states.

FIG. 8 depicts a flow diagram of another example, non-limiting method 800 that can employ quantum entanglement forging for quantum simulations, in accordance with various aspects and embodiments of the disclosed subject matter. The method 800 can be performed by, for example, the TMC and/or a processor component, which can be associated with a data store. Repetitive description of like elements employed in other embodiments described herein is or may be omitted for sake of brevity.

At 802, a weakly entangled variational state can be decomposed into respective local components of the weakly entangled variational state, wherein the respective local components can describe respective tensor product states. The decomposer component can decompose the weakly entangled variational state into respective local components of the weakly entangled variational state, wherein the respective local components can describe respective tensor product states.

At 804, a first quantum simulation of a first local component of the weakly entangled variational state can be performed using a set of qubits and first quantum circuitry, wherein the first location component can describe a first tensor product state of the respective tensor product states.

At 806, a second quantum simulation of a second local component of the weakly entangled variational state can be performed using the set of qubits and second quantum circuitry, wherein the second location component can describe a second tensor product state of the respective tensor product states. The quantum computing simulator component can perform the first quantum simulation of the first local component of the weakly entangled variational state using the set of qubits and the first quantum circuitry, wherein the first location component can describe the first tensor product state (and/or one or more other tensor product states associated with the first local component). Subsequently, the quantum computing simulator component also can perform the second quantum simulation of the second local component of the weakly entangled variational state using the set of qubits and the second quantum circuitry, wherein the second location component can describe the second tensor product state (and/or one or more other tensor product states associated with the second local component). In some embodiments, the first and second quantum simulations can be or can comprise first and second entanglement forging VQE simulations.

At 808, a first portion of a variational energy contributed by the first tensor product state associated with the first local component can be determined based at least in part on a first quantum simulation result of the first quantum simulation. At 810, a second portion of the variational energy contributed by the second tensor product state associated with the second local component can be determined based at least in part on a second quantum simulation result of the second quantum simulation. For instance, the quantum computing simulator component can estimate respective portions (e.g., the first portion and second portion, and/or one or more other respective portions) of the variational energy contributed by the respective tensor product states (e.g., the first tensor product state and second tensor product state, and/or one or more other respective tensor product states) associated with the respective local components (e.g., the first local component and second local component) based at least in part on the respective quantum simulation results (e.g., the first and second quantum simulation results). The EFC can determine the respective portions of the variational energy contributed by the respective tensor product states associated with the respective local components based at least in part on (e.g., as being, or as a function of) the estimated respective portions of the variational energy contributed by the respective tensor product states.

At 812, the variational energy associated with the weakly entangled variational state can be determined based at least in part on the first portion of the variational energy contributed by the first tensor product state and the second portion of the variational energy contributed by the second tensor product state. The energy determination component can determine the variational energy (e.g., the amount of variational energy) associated with the weakly entangled variational state based at least in part on (e.g., as a function of and/or as a linear combination of) the first portion of the variational energy contributed by the first tensor product state (and/or one or more other portions of the variational energy that is or are contributed by one or more other tensor product states associated with the first local component) and the second portion of the variational energy contributed by the second tensor product state (and/or one or more other portions of the variational energy that is or are contributed by one or more other tensor product states associated with the second local component).

At 814, the variational energy associated with the weakly entangled variational state can be presented. The EFC can present (e.g., display or communicate) the variational energy associated with the weakly entangled variational state as an output via a desired interface (e.g., display screen or audio speaker), or via a desired communication channel (e.g., wireline or wireless communication channel) to a communication device.

For simplicity of explanation, the methods and/or computer-implemented methods are depicted and described as a series of acts. It is to be understood and appreciated that the disclosed subject matter is not limited by the acts illustrated and/or by the order of acts, for example acts can occur in various orders and/or concurrently, and with other acts not presented and described herein. Furthermore, not all illustrated acts can be required to implement the computer-implemented methods in accordance with the disclosed subject matter. In addition, those skilled in the art will understand and appreciate that the computer-implemented methods could alternatively be represented as a series of interrelated states via a state diagram or events. Additionally, it should be further appreciated that the computer-implemented methods disclosed hereinafter and throughout this specification are capable of being stored on an article of manufacture to facilitate transporting and transferring such computer-implemented methods to computers. The term article of manufacture, as used herein, is intended to encompass a computer program accessible from any computer-readable device or storage media.

Figure 9:
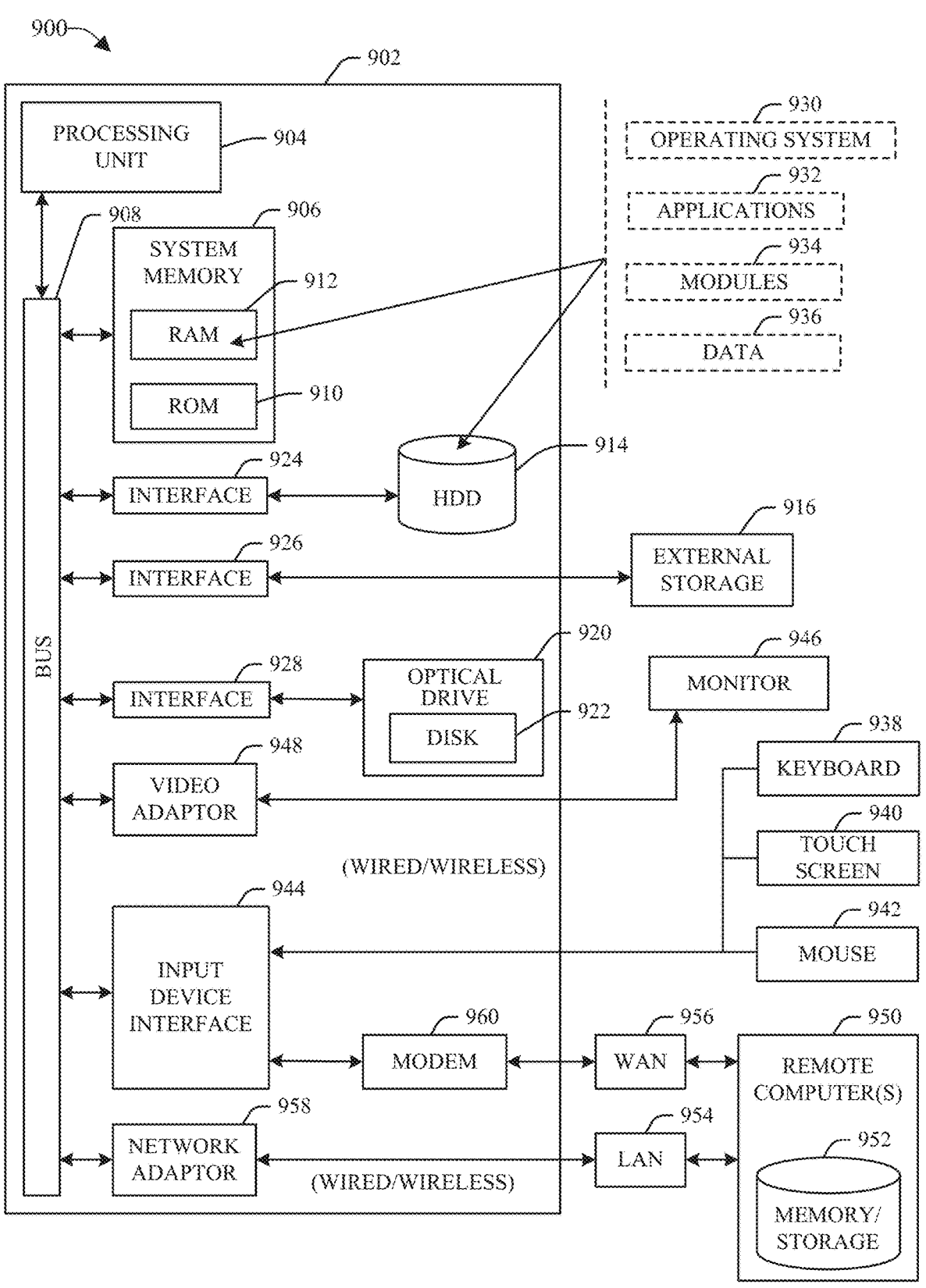
FIG. 9 illustrates a block diagram of an example, non-limiting operating environment in which one or more embodiments described herein can be facilitated.

In order to provide additional context for various embodiments described herein, FIG. 9 and the following discussion are intended to provide a general description of a suitable computing environment 900 in which the various embodiments of the embodiments described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, or other type of program modules, that can perform particular tasks or implement particular abstract data types. Moreover, those skilled in the art will appreciate that the methods can be practiced with other computer system configurations, including single-processor or multiprocessor computer systems, minicomputers, mainframe computers, IoT devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 9, the example environment 900 for implementing various embodiments of the aspects described herein includes a computer 902, the computer 902 including a processing unit 904, a system memory 906 and a system bus 908. The system bus 908 couples system components including, but not limited to, the system memory 906 to the processing unit 904. The processing unit 904 can be any of various commercially available processors. Dual microprocessors and other multi-processor architectures can also be employed as the processing unit 904.

The system bus 908 can be any of several types of bus structure that can further interconnect to a memory bus (with or without a memory controller), a peripheral bus, and a local bus using any of a variety of commercially available bus architectures. The system memory 906 includes ROM 910 and RAM 912. A basic input/output system (BIOS) can be stored in a non-volatile memory such as ROM, erasable programmable read only memory (EPROM), EEPROM, which BIOS contains the basic routines that help to transfer information between elements within the computer 902, such as during startup. The RAM 912 can also include a high-speed RAM such as static RAM for caching data.

The computer 902 further includes an internal hard disk drive (HDD) 914 (e.g., EIDE, SATA), one or more external storage devices 916 (e.g., a magnetic floppy disk drive (FDD) 916, a memory stick or flash drive reader, a memory card reader, or other type of external storage device) and an optical disk drive 920 (e.g., which can read or write from a CD-ROM disc, a DVD, a BD, or other type of optical disk drive). While the internal HDD 914 is illustrated as located within the computer 902, the internal HDD 914 can also be configured for external use in a suitable chassis (not shown). Additionally, while not shown in environment 900, a solid state drive (SSD) could be used in addition to, or in place of, an HDD 914. The HDD 914, external storage device(s) 916 and optical disk drive 920 can be connected to the system bus 908 by an HDD interface 924, an external storage interface 926 and an optical drive interface 928, respectively. The interface 924 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 902, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 912, including an operating system 930, one or more application programs 932, other program modules 934 and program data 936. All or portions of the operating system, applications, modules, and/or data can also be cached in the RAM 912. The systems and methods described herein can be implemented utilizing various commercially available operating systems or combinations of operating systems.

Computer 902 can optionally comprise emulation technologies. For example, a hypervisor (not shown) or other intermediary can emulate a hardware environment for operating system 930, and the emulated hardware can optionally be different from the hardware illustrated in FIG. 9. In such an embodiment, operating system 930 can comprise one virtual machine (VM) of multiple VMs hosted at computer 902. Furthermore, operating system 930 can provide runtime environments, such as the Java runtime environment or the .NET framework, for applications 932. Runtime environments are consistent execution environments that allow applications 932 to run on any operating system that includes the runtime environment. Similarly, operating system 930 can support containers, and applications 932 can be in the form of containers, which are lightweight, standalone, executable packages of software that include, e.g., code, runtime, system tools, system libraries and settings for an application.

Further, computer 902 can be enable with a security module, such as a trusted processing module (TPM). For instance with a TPM, boot components hash next in time boot components, and wait for a match of results to secured values, before loading a next boot component. This process can take place at any layer in the code execution stack of computer 902, e.g., applied at the application execution level or at the operating system (OS) kernel level, thereby enabling security at any level of code execution.

A user can enter commands and information into the computer 902 through one or more wired/wireless input devices, e.g., a keyboard 938, a touch screen 940, and a pointing device, such as a mouse 942. Other input devices (not shown) can include a microphone, an infrared (IR)

remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 904 through an input device interface 944 that can be coupled to the system bus 908, but can be connected by other interfaces, such as a parallel port, an IEEE 1394 serial port, a game port, a USB port, an IR interface, a BLUETOOTH™ interface, or other type of interface.

A monitor 946 or other type of display device can be also connected to the system bus 908 via an interface, such as a video adapter 948. In addition to the monitor 946, a computer typically includes other peripheral output devices (not shown), such as speakers, printers, or other type of peripheral output device.

The computer 902 can operate in a networked environment using logical connections via wired and/or wireless communications to one or more remote computers, such as a remote computer(s) 950. The remote computer(s) 950 can be a workstation, a server computer, a router, a personal computer, portable computer, microprocessor-based entertainment appliance, a peer device or other common network node, and typically includes many or all of the elements described relative to the computer 902, although, for purposes of brevity, only a memory/storage device 952 is illustrated. The logical connections depicted include wired/wireless connectivity to a local area network (LAN) 954 and/or larger networks, e.g., a wide area network (WAN) 956. Such LAN and WAN networking environments are commonplace in offices and companies, and facilitate enterprise-wide computer networks, such as intranets, all of which can connect to a global communications network, e.g., the Internet.

When used in a LAN networking environment, the computer 902 can be connected to the local network 954 through a wired and/or wireless communication network interface or adapter 958. The adapter 958 can facilitate wired or wireless communication to the LAN 954, which can also include a wireless access point (AP) disposed thereon for communicating with the adapter 958 in a wireless mode.

When used in a WAN networking environment, the computer 902 can include a modem 960 or can be connected to a communications server on the WAN 956 via other means for establishing communications over the WAN 956, such as by way of the Internet. The modem 960, which can be internal or external and a wired or wireless device, can be connected to the system bus 908 via the input device interface 944. In a networked environment, program modules depicted relative to the computer 902 or portions thereof, can be stored in the remote memory/storage device 952. It will be appreciated that the network connections shown are example and other means of establishing a communications link between the computers can be used.

When used in either a LAN or WAN networking environment, the computer 902 can access cloud storage systems or other network-based storage systems in addition to, or in place of, external storage devices 916 as described above. Generally, a connection between the computer 902 and a cloud storage system can be established over a LAN 954 or WAN 956, e.g., by the adapter 958 or modem 960, respectively. Upon connecting the computer 902 to an associated cloud storage system, the external storage interface 926 can, with the aid of the adapter 958 and/or modem 960, manage storage provided by the cloud storage system as it would other types of external storage. For instance, the external storage interface 926 can be configured to provide access to cloud storage sources as if those sources were physically connected to the computer 902.

The computer 902 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, or other type of wirelessly detectable tag), and telephone. This can include Wireless Fidelity (Wi-Fi) and BLUETOOTH™ wireless technologies. Thus, the communication can be a predefined structure as with a conventional network or simply an ad hoc communication between at least two devices.

Wi-Fi, or Wireless Fidelity, allows connection to the Internet from a couch at home, in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, or other version of IEEE 802.11) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

It is to be noted that aspects, features, and/or advantages of the disclosed subject matter can be exploited in substantially any wireless telecommunication or radio technology, e.g., Wi-Fi; Gi-Fi; Hi-Fi; BLUETOOTH™; worldwide interoperability for microwave access (WiMAX); enhanced general packet radio service (enhanced GPRS); third generation partnership project (3GPP) long term evolution (LTE); third generation partnership project 2 (3GPP2) ultra mobile broadband (UMB); 3GPP universal mobile telecommunication system (UMTS); high speed packet access (HSPA); high speed downlink packet access (HSDPA); high speed uplink packet access (HSUPA); GSM (global system for mobile communications) EDGE (enhanced data rates for GSM evolution) radio access network (GERAN); UMTS terrestrial radio access network (UTRAN); LTE advanced (LTE-A); or other type of wireless telecommunication or radio technology. Additionally, some or all of the aspects described herein can be exploited in legacy telecommunication technologies, e.g., GSM. In addition, mobile as well non-mobile networks (e.g., the internet, data service network such as internet protocol television (IPTV), or other type of non-mobile network) can exploit aspects or features described herein.

One or more embodiments can be a system, a method, an apparatus and/or a computer program product at any possible technical detail level of integration. The computer program product can include a computer readable storage medium (or media) having computer readable program instructions thereon for causing a processor to carry out aspects of the one or more embodiments. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the disclosed subject matter can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the disclosed subject matter.

Aspects of disclosed subject matter are described herein with reference to flowchart illustrations and/or block diagrams of methods, apparatus (systems), and computer program products according to embodiments of the subject disclosure. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the disclosed subject matter. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the computer-implemented methods disclosed herein can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like.

The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM)). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:

decomposing, by a processor, using a Schmidt decomposition and Schmidt coefficients, a non-maximally entangled variational state into respective local components of the non-maximally entangled variational state for respective simulation on a quantum computing system comprising a quantum processor comprising a set of qubits, wherein the set of qubits consists of a first quantity of qubits that is less than a second quantity of qubits needed to perform a full simulation of the non-maximally entangled variational state, wherein the respective local components describe respective tensor product states, wherein the decomposing comprises rejecting one or more bit strings associated with the respective tensor product states in response to the one or more bit strings differing from a defined reference bit string by a defined number of bits, and wherein the decomposing further comprises rejecting updates of respective Schmidt coefficients of the local components that exceed a defined fixed upper bound;

individually performing, by the quantum processor, using the set of qubits, respective quantum simulations of the respective local components to generate respective variational energy contributions of the respective tensor product states; and determining, by the processor, a variational energy associated with the non-maximally entangled variational state based on a combination of the respective variational energy contributions of the respective tensor product states.

2. The computer-implemented method of claim 1, wherein the respective quantum simulations comprise a variational quantum eigensolver simulation.

3. The computer-implemented method of claim 1, wherein the respective tensor product states comprise a first tensor product state and a second tensor product state, wherein the respective local components of the non-maximally entangled variational state comprise a first local component associated with the first tensor product state and a second local component associated with the second tensor product state, and wherein the individually performing the respective quantum simulations comprises:

performing, by the quantum processor, a first quantum simulation of the first tensor product state using a first quantum circuit; and performing, by the quantum processor, a second quantum simulation of the second tensor product state using a second quantum circuit.

4. The computer-implemented method of claim 3, the determining the variational energy comprises:

estimating, by the processor, a first portion of the variational energy based on a first variational energy contribution generated by the first quantum simulation of the first tensor product state; and estimating, by the processor, a second portion of the variational energy based on a second variational energy contribution generated by the second quantum simulation of the second tensor product state.

5. The computer-implemented method of claim 1, wherein the combination is a linear combination of the respective variational energy contributions.

6. The computer-implemented method of claim 1, wherein the determining the variational energy comprises performing a non-quantum computing calculation of the variational energy based on the combination of the respective variational energy contributions.

7. The computer-implemented method of claim 1, wherein the respective local components comprise a first local component of the non-maximally entangled variational state and a Hamiltonian, and a second local component of the non-maximally entangled variational state and the Hamiltonian, and wherein the computer-implemented method further comprises:

creating, by the quantum processor, a first entangled state among a first subset of the set of qubits associated with first quantum circuitry based on a first quantum simulation relating to the first local component;

creating, by the quantum processor, a second entangled state among a second subset of the set of qubits associated with second quantum circuitry based on a second quantum simulation relating to the second local component, wherein the first subset is different from the second subset;

performing, by the processor, a non-quantum computing simulation of a third entangled state among a third subset of the set of qubits, wherein the third subset comprises qubits from the first subset and the second subset; and determining, by the processor, an entanglement entropy relating to the third subset of qubits based on the non-quantum computing simulation.

8. A system, comprising:

a memory that stores computer-executable components; and a processor, operatively coupled to the memory, that executes at least one of the computer-executable components that:

decomposes, using a Schmidt decomposition and Schmidt coefficients, a non-maximally entangled variational state into respective local components of the non-maximally entangled variational state for respective simulation on a quantum computing system comprising a quantum processor comprising a set of qubits, wherein the set of qubits consists of a first quantity of qubits that is less than a second quantity of qubits needed to perform a full simulation of the non-maximally entangled variational state, wherein the respective local components describe respective tensor product states, wherein the decomposing comprises rejecting one or more bit strings associated with the respective tensor product states in response to the one or more bit strings differing from a defined reference bit string by a defined number of bits, and wherein the decomposing further comprises rejecting updates of respective Schmidt coefficients of the local components that exceed a defined fixed upper bound;

individually performs, by the quantum processor, using the set of qubits, respective quantum simulations of the respective local components to generate respective variational energy contributions of the respective tensor product states; and determines a variational energy associated with the non-maximally entangled variational state based on a combination of the respective variational energy contributions of the respective tensor product states.

9. The system of claim 8, wherein the respective quantum simulations comprise a variational quantum eigensolver simulation.

10. The system of claim 8, wherein the respective tensor product states comprise a first tensor product state and a second tensor product state, wherein the respective local components of the non-maximally entangled variational state comprise a first local component associated with the first tensor product state and a second local component associated with the second tensor product state, and wherein the individually performing the respective quantum simulations comprises:

performing, by the quantum processor, a first quantum simulation of the first tensor product state using a first quantum circuit, and performing, by the quantum processor, a second quantum simulation of the second tensor product state using a second quantum circuit.

11. The system of claim 10, wherein the determining the variational energy comprises:

estimating a first portion of the variational energy based on a first variational energy contribution generated by the first quantum simulation of the first tensor product state, and estimating a second portion of the variational energy based on a second variational energy contribution generated by the second quantum simulation of the second tensor product state.

12. The system of claim 8, wherein the combination is a linear combination of the respective variational energy contributions.

13. The system of claim 8, wherein the determining the variational energy comprises performing a non-quantum computing calculation of the variational energy based on the combination of the respective variational energy contributions.

14. The system of claim 8, wherein the respective local components comprise a first local component of the non-maximally entangled variational state and a Hamiltonian, and a second local component of the non-maximally entangled variational state and the Hamiltonian, and wherein the at least one of the computer-executable components further:

creates, by the quantum processor, a first entangled state among a first subset of the set of qubits associated with first quantum circuitry based on a first quantum simulation relating to the first local component;

creates, by the quantum processor, a second entangled state among a second subset of the set of qubits associated with second quantum circuitry based on a second quantum simulation relating to the second local component, wherein the first subset is different from the second subset;

performs a non-quantum computing simulation of a third entangled state among a third subset of the set of qubits, wherein the third subset comprises qubits from the first subset and the second subset; and an entanglement entropy relating to the third subset of qubits based on the non-quantum computing simulation.

15. A computer program product that facilitates quantum simulations associated with quantum circuitry, the computer program product comprising a non-transitory computer readable medium having program instructions embodied therewith, the program instructions are executable by a processor to cause the processor to:

decompose, using a Schmidt decomposition and Schmidt coefficients, a non-maximally entangled variational state into respective local components of the non-maximally entangled variational state for respective simulation on a quantum computing system comprising a quantum processor comprising a set of qubits, wherein the set of qubits consists of a first quantity of qubits that is less than a second quantity of qubits needed to perform a full simulation of the non-maximally entangled variational state, wherein the respective local components describe respective tensor product states, wherein the decomposing comprises rejecting one or more bit strings associated with the respective tensor product states in response to the one or more bit strings differing from a defined reference bit string by a defined number of bits, and wherein the decomposing further comprises rejecting updates of respective Schmidt coefficients of the local components that exceed a defined fixed upper bound;

individually perform, by the quantum processor, using the set of qubits, respective quantum simulations of the respective local components to generate respective variational energy contributions of the respective tensor product states; and determine a variational energy associated with the non-maximally entangled variational state based on a combination of the respective variational energy contributions of the respective tensor product states.

16. The computer program product of claim 15, wherein the respective tensor product states comprise a first tensor product state and a second tensor product state, wherein the respective local components of the non-maximally entangled variational state comprise a first local component associated with the first tensor product state and a second local component associated with the second tensor product state, individually performing the respective quantum simulations comprises:

performing, by the quantum processor, a first quantum simulation of the first tensor product state using a first quantum circuit;

determine a first portion of the variational energy based on a first variational energy contribution generated by the first quantum simulation of the first tensor product state;

performing, by the quantum processor, a second quantum simulation of the second tensor product state using a second quantum circuit; and determine a second portion of the variational energy based on a second variational energy contribution generated by the second quantum simulation of the second tensor product state.

17. The computer program product of claim 15, wherein the respective quantum simulations comprise a variational quantum eigensolver simulation.

18. The computer program product of claim 15, wherein the combination is a linear combination of the respective variational energy contributions.

19. The computer program product of claim 15, wherein the determining the variational energy comprises performing a non-quantum computing calculation of the variational energy based on the combination of the respective variational energy contributions.

20. The computer program product of claim 15, wherein the respective local components comprise a first local component of the non-maximally entangled variational state and a Hamiltonian, and a second local component of the non-maximally entangled variational state and the Hamiltonian, and wherein the program instructions are executable by the processor to cause the processor to:

create, by the quantum processor, a first entangled state among a first subset of the set of qubits associated with first quantum circuitry based on a first quantum simulation relating to the first local component;

create, by the quantum processor, a second entangled state among a second subset of the set of qubits associated with second quantum circuitry based on a second quantum simulation relating to the second local component, wherein the first subset is different from the second subset;

perform a non-quantum computing simulation of a third entangled state among a third subset of the set of qubits, wherein the third subset comprises qubits from the first subset and the second subset; and determine an entanglement entropy relating to the third subset of qubits based on the non-quantum computing simulation.

\* \* \* \* \*